US009071273B2

(12) United States Patent
Resnick

(10) Patent No.: US 9,071,273 B2
(45) Date of Patent: Jun. 30, 2015

(54) EXTENDED SINGLE-BIT ERROR CORRECTION AND MULTIPLE-BIT ERROR DETECTION

(71) Applicant: Micron Technology, Inc., Boise, ID (US)

(72) Inventor: David R. Resnick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/059,063

(22) Filed: Oct. 21, 2013

(65) Prior Publication Data

US 2014/0053045 A1    Feb. 20, 2014

Related U.S. Application Data

(63) Continuation of application No. 13/556,042, filed on Jul. 23, 2012, now Pat. No. 8,566,677, which is a continuation of application No. 12/417,390, filed on Apr. 2, 2009, now Pat. No. 8,230,305.

(51) Int. Cl.
*H03M 13/05* (2006.01)
*G06F 11/10* (2006.01)
*H03M 13/19* (2006.01)

(52) U.S. Cl.
CPC ........... *H03M 13/05* (2013.01); *G06F 11/1008* (2013.01); *H03M 13/19* (2013.01)

(58) Field of Classification Search
CPC . G06F 11/1008; G06F 11/14; G06F 11/1012; G06F 11/08; G06F 11/10; H03M 13/098; H03M 13/11; H03M 13/05; H03M 13/19; H03M 13/154
See application file for complete search history.

(56) References Cited

U.S. PATENT DOCUMENTS

| | | | | |
|---|---|---|---|---|
| 4,852,100 A | * | 7/1989 | Christensen et al. | 714/763 |
| 6,024,486 A | * | 2/2000 | Olarig et al. | 714/763 |
| 6,367,046 B1 | * | 4/2002 | Chapman et al. | 714/752 |
| 6,453,440 B1 | * | 9/2002 | Cypher | 714/758 |
| 6,480,982 B1 | * | 11/2002 | Chan et al. | 714/764 |
| 6,604,222 B1 | * | 8/2003 | Jensen | 714/785 |
| 7,080,305 B2 | | 7/2006 | Welbon et al. | |
| 8,230,305 B2 | * | 7/2012 | Resnick | 714/777 |
| 8,566,677 B2 | * | 10/2013 | Resnick | 714/777 |
| 2004/0123213 A1 | * | 6/2004 | Welbon et al. | 714/752 |
| 2004/0153902 A1 | * | 8/2004 | Machado et al. | 714/710 |
| 2008/0288845 A1 | * | 11/2008 | Tsfati et al. | 714/748 |
| 2009/0319863 A1 | * | 12/2009 | Shirai | 714/755 |
| 2010/0257432 A1 | | 10/2010 | Resnick | |
| 2013/0047054 A1 | | 2/2013 | Resnick | |

FOREIGN PATENT DOCUMENTS

| | | |
|---|---|---|
| CN | 101083514 A | 12/2007 |
| WO | WO-2010115038 A2 | 10/2010 |
| WO | WO-2010115038 A3 | 1/2011 |

OTHER PUBLICATIONS

"Chinese Application Serial No. 201080014994.2, Office Action mailed Aug. 15, 2013", 9 pgs.
"International Application Serial No. PCT/US2010/029683, Preliminary Report on Patentability mailed Oct. 13, 2011", 6 pgs.
"International Application Serial No. PCT/US2010/029683, Search Report mailed Nov. 17, 2010", 4 pgs.
"International Application Serial No. PCT/US2010/029683, Written Opinion mailed Nov. 17, 2010", 4 pgs.
"Chinese Application Serial No. 201080014994.2, Response filed Feb. 26, 2014 to Office Action mailed Aug. 15, 2013", w/English Claims, 18 pgs.

* cited by examiner

*Primary Examiner* — Nadeem Iqbal
(74) *Attorney, Agent, or Firm* — Schwegman Lundberg & Woessner, P.A.

(57) ABSTRACT

Some embodiments include apparatus and methods to prevent at least one of misidentifying and ignoring multiple-bit errors if the multiple-bit errors include a plurality of erroneous data bits that belong to only one specific group of a plurality of groups of data bits and if none of the other groups of the plurality of groups have errors.

20 Claims, 17 Drawing Sheets

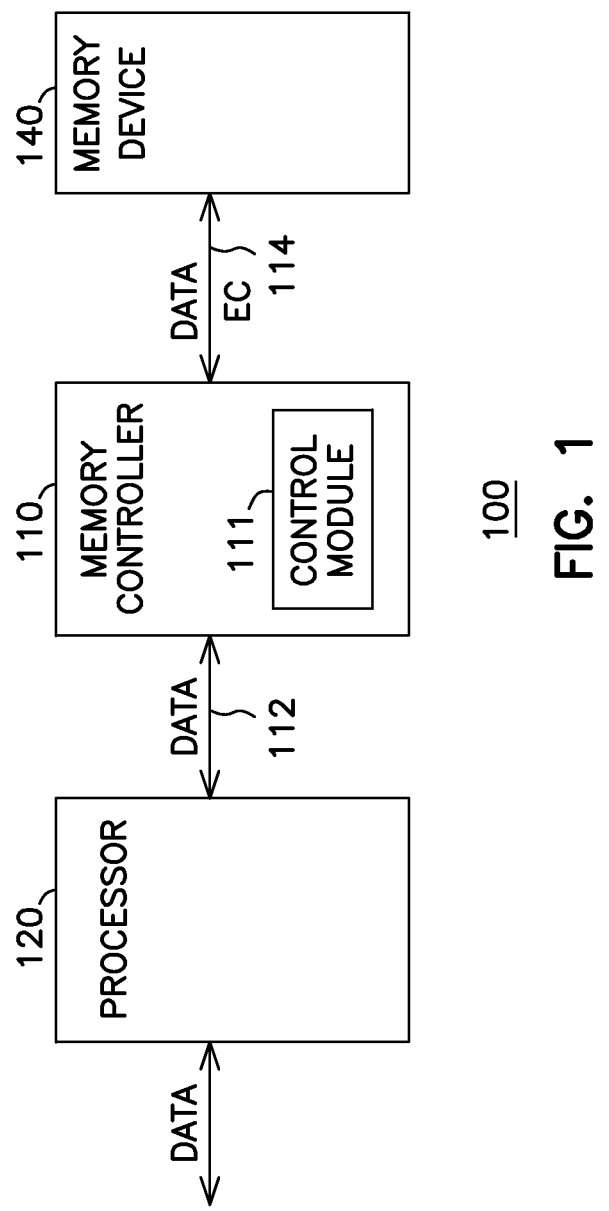

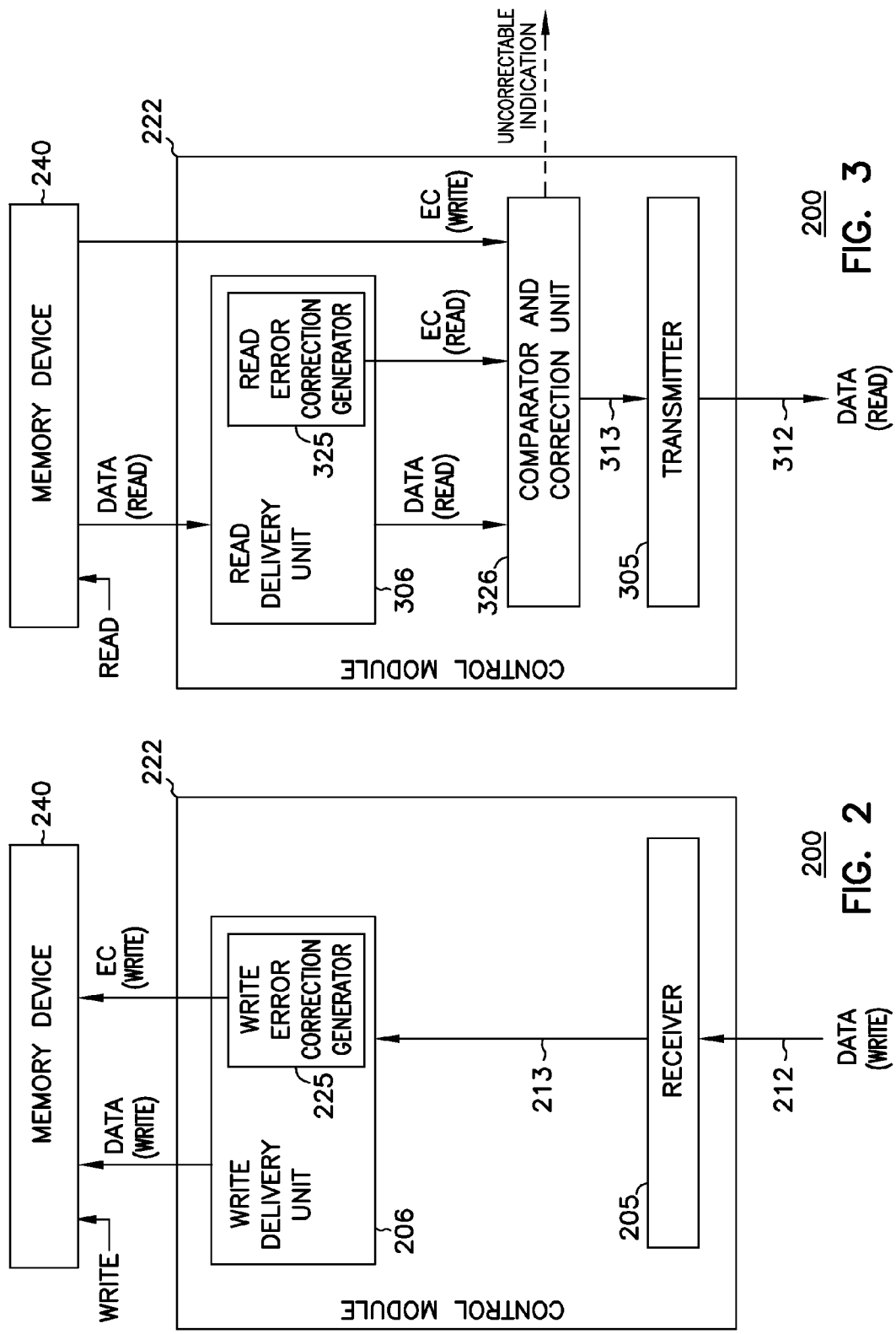

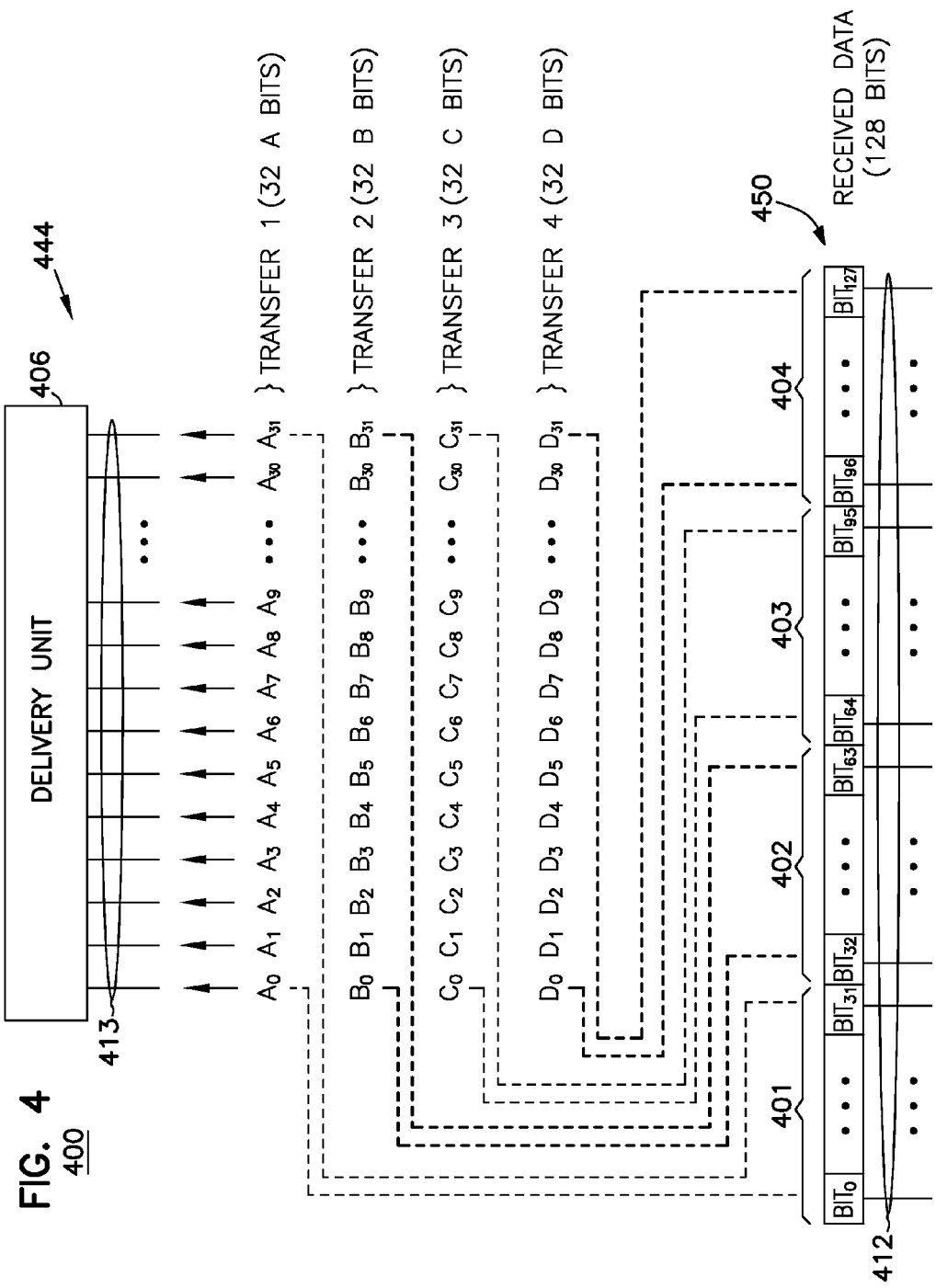

500

| WRITE EXAMPLE | READ EXAMPLE 17 | READ EXAMPLE 18 |
|---|---|---|
| | DETECTION OF MULTIPLE BIT ERROR | DETECTION OF MULTIPLE BIT ERROR |

951 — EC WRITE VALUE
1317 — EC READ VALUE
1318 — EC READ VALUE

| | EC WRITE VALUE | | EC READ VALUE | | EC READ VALUE | |
|---|---|---|---|---|---|---|
| EC BITS 0–7 | 1 | $EC_0$ | 0/1 | | 0/1 | |
| | 0 | $EC_1$ | 0/1 | | 0/1 | |
| | 1 | $EC_2$ | 0/1 | | 0/1 | |
| | 0 | $EC_3$ | 0/1 | | 0/1 | |
| | 1 | $EC_4$ | 0/1 | | 0/1 | |
| | 1 | $EC_5$ | 0/1 | | 0/1 | |
| | 1 | $EC_6$ | 0/1 | | 0/1 | |
| | 1 | $EC_7$ | 0/1 | | 0/1 | |
| EC BITS 8–11 | 0 | $EC_8$ | 0 | | 1 | ← TRANSFER 1 ERROR |
| | 0 | $EC_9$ | 1 | ← TRANSFER 2 ERROR | 1 | ← TRANSFER 2 ERROR |
| | 1 | $EC_{10}$ | 0 | ← TRANSFER 3 ERROR | 0 | ← TRANSFER 3 ERROR |
| | 1 | $EC_{11}$ | 1 | | 0 | ← TRANSFER 4 ERROR |

FIG. 13

EXTENDED SINGLE-BIT ERROR CORRECTION AND MULTIPLE-BIT ERROR DETECTION

PRIORITY APPLICATION

This application is a continuation of U.S. application Ser. No. 13/556,042, filed Jul. 23, 2012, which is a continuation of U.S. application Ser. No. 12/417,390, filed Apr. 2, 2009, now issued as U.S. Pat. No. 8,230,305, all of which are incorporated herein by reference in their entirety.

BACKGROUND

Data and other information used in computer systems and various electronic devices usually consist of many information pieces called bits. Each bit has a value such as binary zero or binary one. In some situations, factors such as physical defects, cosmic rays, and improper use may change the value of a single bit or the values of multiple bits of the data information stored in these systems or devices. Therefore, erroneous data information may occur in some situations. Many conventional systems or devices may include error detection and correction components to detect and correct some specific errors in the data information. For example, some systems have components to correct a single erroneous bit of data information. However, even with the inclusion of error detection and correction components, some conventional systems may improperly detect or wrongly correct some errors, leading to potential system malfunction.

BRIEF DESCRIPTION OF THE DRAWINGS

FIG. 1 shows a block diagram of a system having a control module 111, according to an embodiment of the invention.

FIG. 2 shows a partial block diagram of a system including a control module with components that the system may use in its write operation, according to an embodiment of the invention.

FIG. 3 shows a partial block diagram of the system of FIG. 2 including a control module with components that the system may use in its read operation, according to an embodiment of the invention.

FIG. 4 shows a partial block diagram of a system with data information being organized into different subsets, according to an embodiment of the invention.

FIG. 13 shows various example values of read error correction information where an error is detected in an even number of transfers of data information, according to an embodiment of the invention.

DETAILED DESCRIPTION

Figure 5:
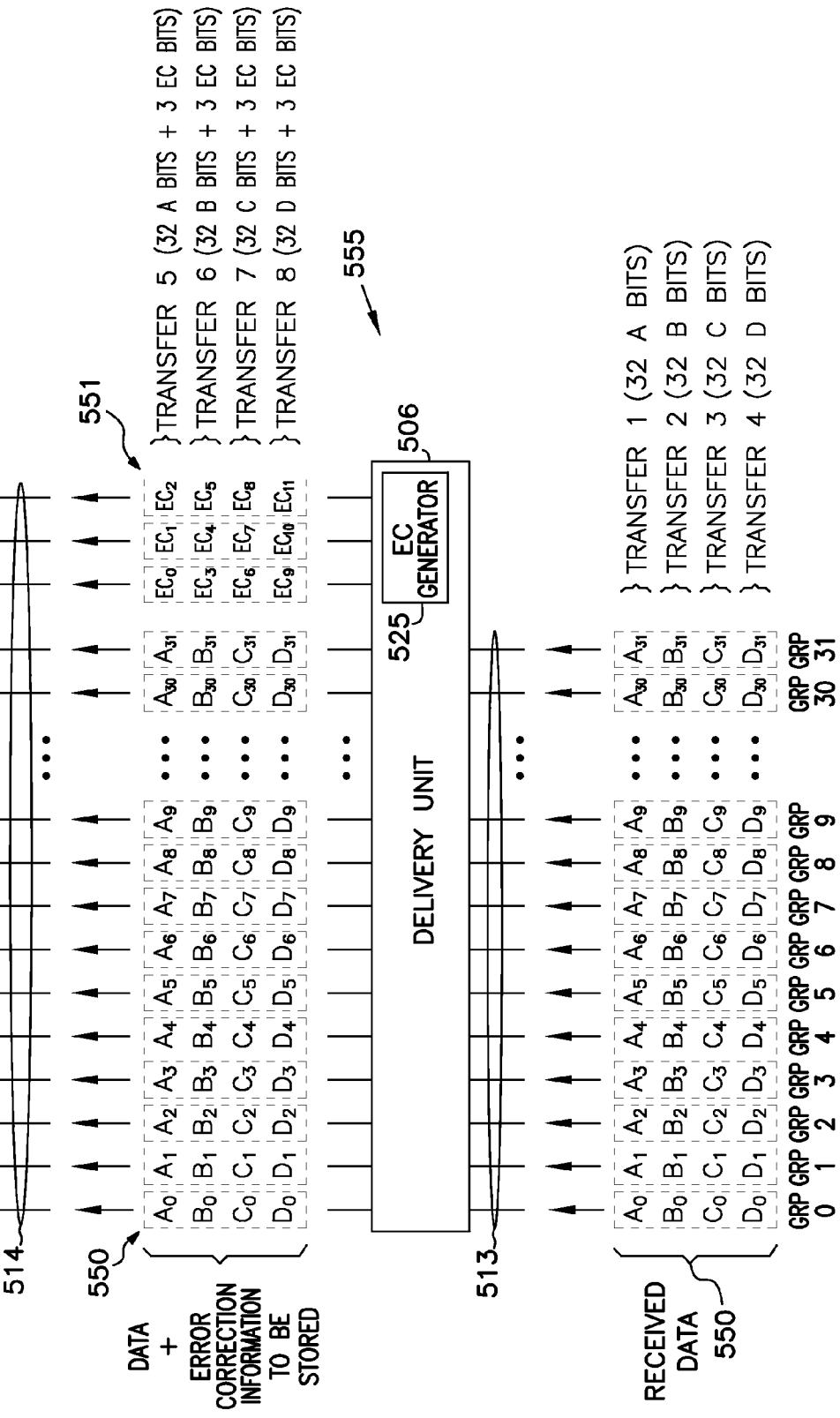
FIG. 5 shows a partial block diagram of a system with data information grouped into different groups, according to an embodiment of the invention.

FIG. 1 shows a block diagram of system 100 having a control module 111, according to an embodiment of the invention. System 100 may include or be included in an electronic product such as a computer, a television, a cellular phone, or other electronic products. System 100 includes a memory controller 110 to facilitate transfer of data (DATA) and other information on lines 112 and lines 114 between a processor 120 and a memory device 140. The data information includes data bits.

System 100 uses control module 111 to generate error correction information (EC) associated with data information when the data information is stored into memory device 140 in a write operation of system 100. System 100 also uses control module 111 to generate other error correction information associated with the data information when the data information is retrieved from memory device 140 in a read operation of system 100. Control module 111 compares both error correction information generated during the write and read operations to determine whether an error has occurred in the data information. Depending on the type of error, control module 111 may either correct the error or indicate the error as uncorrectable. For example, control module 111 may correct the error if it is a single-bit error, or if the error is a multiple-bit error, control module 111 may issue an indication (e.g., a signal or a flag) notifying the system that the error is uncorrectable or the data information is corrupted. A single-bit error means that only one data bit of the data information is erroneous. A multiple-bit error means that two or more data bits of the data information are erroneous. Some multiple-bit errors described herein can be corrected. For example, if a multiple-bit error has only an odd number of erroneous data bits that belong to a specific group (as discussed in more detail below), the odd number of erroneous data bits can be corrected. System can be configured to correct such multiple-bit errors.

Control module 111 may be implemented by hardware (e.g., physical components), software (e.g., programming instructions), or firmware (a combination of hardware and software), or some combination of hardware, software, and firmware.

FIG. 1 shows the entire control module 111 being located in memory controller 110 as an example. However, the entire control module 111 may be located in processor 112 or in memory 114. Alternatively, different portions of control module 111 may be scattered in different locations among memory controller 110, processor 120, and memory device 140.

In some cases, the entire system 100 may be enclosed in a single integrated circuit (IC) package (or IC chip) such that, in these cases, system 100 may be called a system on a chip. Alternatively, components of system 100 may be enclosed in different IC packages. For example, memory controller 110 and memory device 140 may be enclosed in the same IC package, which may include a single semiconductor die or multiple semiconductor dice, where components of memory controller 110 and memory device 140 are formed.

One skilled in the art may recognize that system 100 may include other components that are not shown to help focus on the embodiments described herein. System 100 may include the components of the systems described below with reference to FIG. 2 through FIG. 18.

FIG. 2 shows a partial block diagram of a system 200 including a control module 222 with components that system 200 may use in its write operation, according to an embodiment of the invention. For example, system 200 may activate a write command (e.g., WRITE) in a write operation. Control module 222 includes a receiver 205 to receive data information (e.g., DATA WRITE) having data bits on lines 212 and transfer the data information to a write delivery unit 206 through lines 213. A device such as a processor (e.g., processor 120 of FIG. 1) may provide data information to control module 222 through lines 212. Control module 222 also includes a write error correction information generator 225 to generate error correction information (e.g., EC WRITE) associated with the data information. In response to the write signal, memory device 240 stores the data information and the error correction information.

FIG. 3 shows a partial block diagram of system 200 of FIG. 2 including a control module 222 with components that system 200 may use in its read operation, according to an embodiment of the invention. As shown in FIG. 3, system 200 may activate a read command (e.g., READ) in a read operation. Control module 222, which is the control module for the write operation, includes a read delivery unit 306 to receive from memory device 240 both data information (e.g., DATA READ) and error correction information (e.g., EC WRITE) that were stored in memory device 240 in a write operation, such as the write operation described above with reference to FIG. 2. As shown in FIG. 3, control module 222 also includes a read error correction information generator 325 to generate error correction information (e.g., EC READ) associated with the data information (e.g., DATA READ) when the data information is retrieved from memory device 240 in a read operation. Read error correction information generator 325 and write error correction information generator 225 of FIG. 2 may be the same generator, because control module 222 generates the read and write error correction information based on the same data information. However, the data information may have different values when it is stored and when it is retrieved if an error has occurred in the data information.

Control module 222 further includes a comparator and correction unit 326 to compare both error correction information EC READ and EC WRITE and generate a comparison result (also called a syndrome). Depending on the value of the comparison result, comparator and correction unit 326 may leave the data information unchanged when no error is detected, correct the data information, or indicate the error as uncorrectable.

For example, if the comparison result indicates that the values of error correction information EC READ and EC WRITE are the same, then control module 222 transfers the data information to a transmitter 305 through lines 313 for further processing without modifying the data information.

In another example, if the comparison result indicates the values of error correction information EC READ and EC WRITE are different, then the control module 222 determines that an error may have occurred in the data information. If control module 222 identifies the error as a single-bit error, it may correct an erroneous data bit by, for example, toggling the value of the erroneous data bit, such that a logic zero value becomes a logic one value, or a logic one value becomes a logic zero value. If control module 222 identifies the error as a multiple-bit error, then it may indicate the error as uncorrectable. In response to the uncorrectable error indication, system 200 may perform appropriate tasks such as aborting its current processes related to the read operation. However, as mentioned above, some multiple-bit errors described herein can be corrected. For example, system 200 can be configured to correct a multiple-bit error if the multiple-bit error has only an odd number of erroneous data bits that belong to only one specific data group.

System 200 may organize data bits of data information and error information bits of error correction information in ways similar to or identical to those of systems 400 and 500 described below with reference to FIG. 4 and FIG. 5.

FIG. 4 shows a partial block diagram of system 400 with data information 450 being organized into different subsets 401, 402, 403, and 404, according to an embodiment of the invention. To help focus on the embodiments described herein, FIG. 4 shows only some components of system 400 that may be used in a write operation of system 400. During a write operation, system 400 may receive data information 450, which may be transferred on lines 412 that are similar to or identical to lines 112 of FIG. 1 or lines 212 of FIG. 2. Lines 412 may include a 128-bit-wide bus (128 separate lines) to concurrently receive (meaning receive in parallel) data bits of data information. As shown in FIG. 4, data information 450 may include 128 data bits, bit zero ($BIT_0$) through bit 127 ($BIT_{127}$). System 400 concurrently receives from a device, such as processor similar to processor 120 of FIG. 1, 128 data bits of data information 450 on lines 412 such that one of bit zero ($BIT_0$) through bit 127 ($BIT_{127}$) is received on one of lines 412.

In the embodiment described here, system 400 can organize the data bits of data information 450 into four subsets 401, 402, 403, and 404, such that each subset includes an equal number of 32 data bits. For example, subset 401 includes bit zero ($BIT_0$) through bit 31 ($BIT_{31}$), subset 402 includes bit 32 ($BIT_{32}$) through bit 63 ($BIT_{63}$), subset 403 includes bit 64 ($BIT_{64}$) through bit 95 ($BIT_{95}$), and subset 404 includes bit 96 ($BIT_{96}$) through bit 127 ($BIT_{127}$).

As shown in FIG. 4, bit zero ($BIT_0$) through bit 127 ($BIT_{127}$) of data information 450 are relabeled as bits A, B, C, and D for ease of describing the embodiments described herein. For example, bit zero ($BIT_0$) through bit 31 ($BIT_{31}$)

are relabeled as data bit $A_0$ through data bit $A_{31}$. Bit 32 ($BIT_{32}$) through bit 63 ($BIT_{63}$) are relabeled as data bit $B_0$ through data bit $B_{31}$. Bit 64 ($BIT_{64}$) through bit 95 ($BIT_{95}$) are relabeled as data bit $C_0$ through data bit $C_{31}$. Bit 96 ($BIT_{96}$) through bit 127 ($BIT_{127}$) are relabeled as data bit $D_0$ through data bit $D_{31}$.

FIG. 4 shows data information 450 having 128 data bits and is organized into an even number of subsets, such as four subsets 401, 402, 403, and 404, as an example. However, the number of data bits, the number of subsets, or both may vary and can be an odd number. For example, the 128 data bits can be organized into eight subsets, with each subset having 16 data bits. In another example, the data information may be grouped into 16 groups, with each group having eight data bits.

FIG. 5 shows a partial block diagram of a system 500 with data information 550 grouped into different groups, according to an embodiment of the invention. To help focus on the embodiments described herein, FIG. 5 shows only some components of system 500 that the system may use in its write operation. System 500 may organize data information 550 in ways like those of system 400 of FIG. 4. For example, system 500 may receive 128 data bits (e.g., $BIT_0$ through $BIT_{127}$) of data information 550 on lines 512 and organize the 128 data bits into four subsets including a subset having data bits $A_0$ through data bit $A_{31}$, a subset having data bit $B_0$ through data bit $B_{31}$, a subset having data bit $C_0$ through data bit $C_{31}$, and a subset having data bit $D_0$ through data bit $D_{31}$. Lines 512 are similar to or identical to lines 112, lines 212, and lines 412 of FIG. 1, FIG. 2, and FIG. 4, respectively. In FIG. 5, system 500 may transfer the subsets in separate transfers, such that the number of subsets (e.g., four) is equal to the number of transfers (e.g., four), as described in details below.

As shown in FIG. 5, system 500 also groups the data bits of data information 550 into 32 groups including group 0 (GRP 0) through group 31 (GRP 31). Each of the groups includes one data bit from each of the subsets. For example, group 0 includes data bits $A_0$, $B_0$, $C_0$, and $D_0$, group 1 includes data bits $A_1$, $B_1$, $C_1$, and $D_1$, and group 31 includes data bits $A_{31}$, $B_{31}$, $C_{31}$, and $D_{31}$.

Control module 555 includes an error correction information generator (EC GENERATOR) 525 to generate error correction information 551 associated with data information 550 and to transfer error correction information 551 and data information 550 to memory device 540 through lines 514. FIG. 5 shows system 500 storing both data information 550 and error correction information 551 in memory device 540, as an example. System 500 may alternatively store a portion of error correction information 551 or all of error correction information 551 in a different location, for example, in a memory controller that is similar to or identical to memory controller 110 of FIG. 1.

In FIG. 5, error correction information 551 includes error information bits $EC_0$ through $EC_{11}$. System 500 also groups error correction information 551 into groups, such as a group including bits $EC_0$, $EC_3$, $EC_6$, and $EC_9$, a group including bits $EC_1$, $EC_4$, $EC_7$, and $EC_{10}$, and a group including bits $EC_2$, $EC_5$, $EC_8$, and $EC_{11}$. System 500 serially transfers the error information bits from each group to one of the lines 514 such that each error information bit of the same group is transferred in a different transfer. For example, system 500 serially transfers error information bits $EC_0$, $EC_3$, $EC_6$, and $EC_9$ to one of one lines 514, such that bits $EC_0$, $EC_3$, $EC_6$, and $EC_9$ are transferred in TRANSFER 1, TRANSFER 2, TRANSFER 3, and TRANSFER 4, respectively. System 500 also serially transfers the data bits from each group on one of the lines 514, such that each data bit of the same group is transferred in a different transfer. For example, system 500 serially transfers data bits $A_0$, $B_0$, $C_0$, and $D_0$ of group GRP 0 on one of lines 514 in four different transfers, such as transfers TRANSFER 1, TRANSFER 2, TRANSFER 3, and TRANSFER 4, respectively. FIG. 5 shows data information being transferred in an order as shown (bits A, B, C, and D) as an example. However, the order may vary. Further, FIG. 5 shows an example of grouping bits $EC_0$ through $EC_{11}$. Other ways of grouping the error correction bits can be done, for example, $EC_0$ through $EC_3$ in one group, $EC_4$ through $EC_7$ in a second group, and $EC_8$ through $EC_{11}$ in a third group.

Since each of the groups of data information 550 and each of the groups of error correction information 551 are transferred on a separate one of lines 514, the number of lines 514 is equal to the sum of the number of groups of data information 550 and the number of the groups of error correction information 551. In this example, the number of lines 514 is 35 (32 data bit groups+3 error information bit groups=35).

With data organized into subsets and groups as shown in FIG. 4 and FIG. 5, a single failure in the lines 514 of FIG. 5 can cause multiple data bits in a single group to fail. The error correction capability of simple error correction methods (a modified Hamming code for example) can correct a single-bit error, detect all errors of two bits, and can mis-detect or mis-correct and therefore serve up corrupt data for errors of three or more data bits.

Given that a single failure can therefore sometimes enable undetected data corruption, an extension of a simple error correction method is needed to at least enable detection of all multi-bit errors caused by those single failures. The extended code generation shown here enables correction of all single bit errors, detection but not correction of all even number of bit errors, and correction of an odd number of bit errors, where the bit errors occur in a single group. Although multi-bit errors that involve multiple groups can be mis-detected or mis-corrected, the chance of that is generally very small.

While the examples here show groups organized around data multiplexed into groups as shown in FIG. 5, any grouping organized around common failure mechanisms can be used to sub-set and group data such that multi-bit errors in such groups can be reliably detected or corrected.

Figure 6:
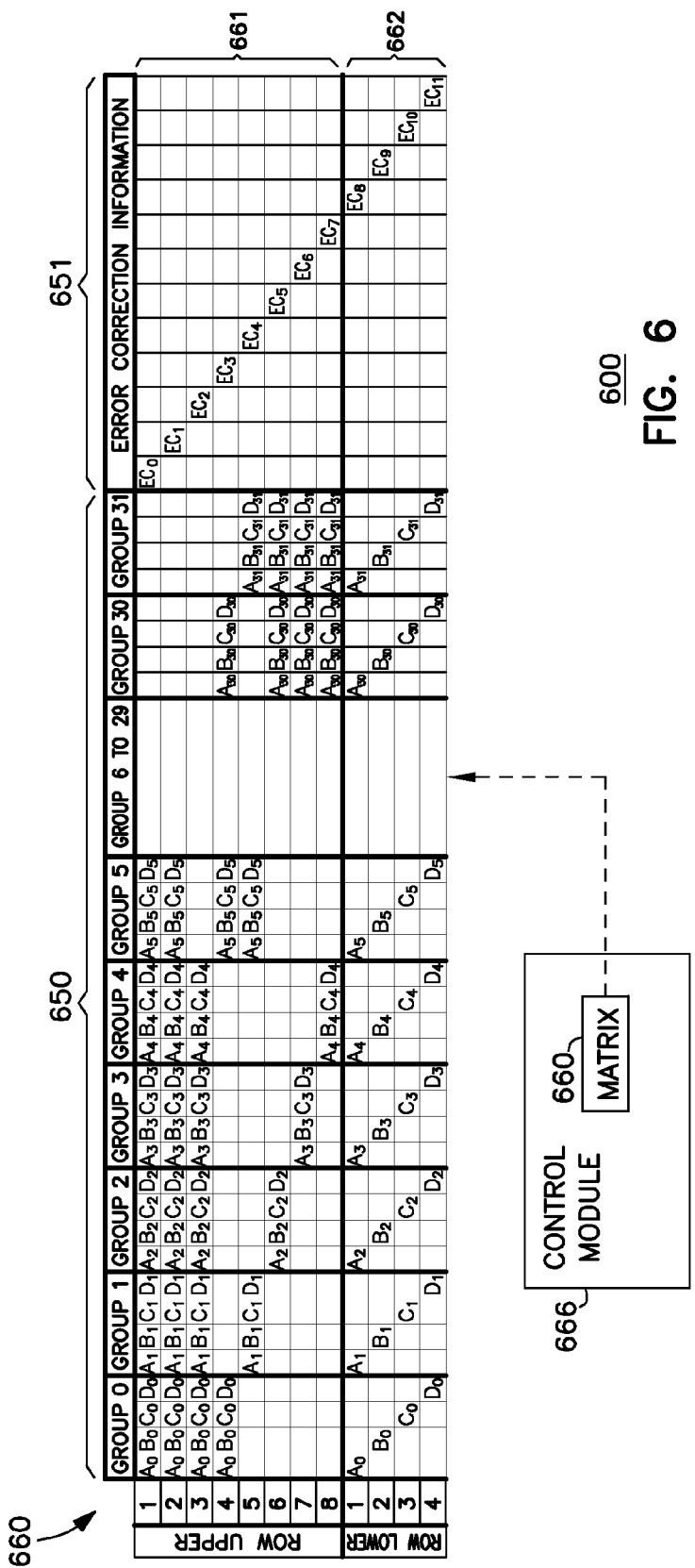
FIG. 6 shows a partial block diagram of a system including a control module to implement a matrix, according to an embodiment of the invention.

FIG. 6 shows a partial block diagram of a system 600 including a control module 666 to implement a matrix 660, according to an embodiment of the invention. Matrix 660 contains a relationship between data information 650 and error correction information 651. Matrix 660 is created before system is fabricated (e.g., during design stage of system 600). Based on matrix 660, components such as hardware, software, or firmware, or combination of these components, are included as ways to implement matrix 660. Matrix 660 may be created based in part on Hamming codes using various combinations of hardware, software, and firmware. The Hamming codes can be odd-weight, single-error-correction, double-error-detection (SECDED) codes. Thus, matrix 660 may also be considered as a modified version of a conventional H-matrix created based on odd-weight SECDED Hamming codes.

Based on data information 650, control module 666 calculates the values of error information bits $EC_0$ through $EC_{11}$ of error correction information 651 during both a write operation of system 600 and a read operation of system 600. In a write operation, the values of error information bits $EC_0$ through $EC_{11}$ (calculated by control module 666 during the write operation) represent the values of error correction information 651 associated with data information to be stored in a memory device of system 600. In a read operation, the values of error information bits $EC_0$ through $EC_{11}$ (calculated by control module 666 during the read operation) represent the values of error correction information 651 associated with data information retrieved from the memory device. Since control module 666 uses the same matrix for reading and writing, it may include the same or similar components to calculate the values of error information bits $EC_0$ through $EC_{11}$ in both the write and read operations.

Matrix 660 contains the relationship between data information 650 and error correction information 651. Control module 666 includes components that implement matrix 660 to calculate the values of error information bits $EC_0$ through $EC_{11}$ based on data information in write and read operations. The values of error information bits $EC_0$ through $EC_{11}$ in write and read operations enable control module 666 (or system 600) to detect errors and correct some specific errors that may occur in the data information.

FIG. 6 shows control module 666 to implement matrix 660 created based on a specific example of data information (e.g., data information 650) having 128 data bits and error correction information (e.g., error correction information 651) having 12 error information bits. Control module 666, however, may implement a matrix that is created based on data information and error correction information having different organizations.

For ease of describing various embodiments herein, matrix 660 is created using the same data organization (e.g., subsets) and grouping of data information 550 described above with reference to FIG. 5. Thus, in FIG. 6, system 600 uses data information 650 with 128 data bits organized into four subsets: a subset including data bits $A_0$ through $A_{31}$, a subset including data bits $B_0$ through $B_{31}$, a subset including data bits $C_0$ through $C_{31}$, and a subset including data bits $D_0$ through $D_{31}$. The subsets are grouped into 32 groups 0 to 31. System 600 transfers the four subsets in four transfers, one transfer for each subset. Matrix 660 may be created as follows.

As shown in FIG. 6, matrix 660 includes two portions, a portion 661 (upper portion) and a portion 662 (lower portion). Each portion includes rows and columns.

The number of columns of matrix 660 is equal to the product of the number of data bit groups (e.g., 32) and the number of data bits (e.g., four) in each group plus the number of error information bits (e.g., 12). Thus, in FIG. 6, the number of columns in matrix 660 is (32×4)+12=140. For simplicity, FIG. 6 omits details of groups 6 through 29 in the columns under these groups.

One skilled in the art will readily recognize that for detection and correction of error in data information of 128 bits based on SECDED type Hamming codes, nine error information bits (similar to bits $EC_0$ through $EC_{11}$) may be used, in addition to the data bits. Therefore, creating a matrix, such as matrix 660, with exactly nine error information bits is sufficient, based on conventional SECDED type Hamming.

However, since system 600 transfers the groups of data information in four transfers with four bits in each group on one line, creating matrix 660 with more than nine error information bits can improve the efficiency of system 600, in particular, the capability to detect cases where multiple data bits fail where conventional modified Hamming codes can mis-detect or mis-correct such failures. To transfer error information bits, additional lines (besides lines to transfer data bits) can be included in system 600. For example, system 600 may include lines that are similar to line 514 of FIG. 5 to transfer data bits and error information bits. As shown in FIG. 5, besides lines used to transfer data bits, three additional lines are included to transfer error information bits $EC_0$ through $EC_{11}$.

In system 600 of FIG. 6, if only two additional lines (instead of three, as shown in FIG. 5) are included to transfer error information bits $EC_0$ through $EC_{11}$ and if system 600 transfers two error information bits on the two additional lines in four transfers (which is the same number of transfers used to transfer the data bits), then the two lines allow transfer of only eight error information bits (two bits in each transfer multiplied by four transfers). Eight additional error information bits is not enough for detection and correction of error in data information of 128 bits based on SECDED type Hamming codes. However, if three additional lines (similar to the three lines in FIG. 5 used to transfer bits $EC_0$ through $EC_{11}$) are included in system 600 to transfer error information bits and if system 600 transfers information bits on the three additional lines in four transfers, then the three lines allow transfer of 12 error information bits (three bits in each transfer multiplied by four transfers). The 12 error information bits is greater than nine error information bits that may be used for detection and correction of error in data information of 128 bits based on SECDED type Hamming codes. Thus, in system 600 (or in system 500 of FIG. 5), 12 bits can be used for error information bits. In matrix 660, the number of columns for error correction information 651 is based on the number of error information bits. As discussed herein, since the error information bits is selected to be 12, the number of columns for error correction information 651 is 12, as shown in FIG. 6.

The number of rows in portion 662 of matrix 660 is equal to the number of transfers. Since system 600 includes four transfers (e.g., TRANSFER 5, TRANSFER 6, TRANSFER 7, and TRANSFER 8 in FIG. 5) to transfer data information 650, the number of rows in portion 662 is equal to four, shown in FIG. 6 as ROW 1 through ROW 4 in "ROW LOWER" section in portion 662. Within each of the groups 0 through 31, each data bit is assigned to a different row in portion 662, such that each of the groups 0 through 31 includes corresponding data bits assigned diagonally the rows and columns in portion 662. The diagonal assignment of data bits in portion 662 in each of the groups 0 through 31, as shown in FIG. 6, is similar to values assigned in an I-matrix.

The number of rows in portion 661 of matrix 660 may be selected such that the expression $_RC_T \exists L$ is satisfied. In this expression, R is number of rows, T is the number of transfers, which is four in this example, L is number of lines on which system 600 transfers data information 650 and error correction information 651, C stands for combinations, and "$\exists$" means equal to or greater than (at least). In other words, if the value of R is known, the term $_RC_T$ represents the number of all possible unique combinations (how many unique combinations) that can be obtained in which each unique combination has "T" different rows among the R rows. Thus, $_RC_T \exists L$, means that the value (number of unique combinations) represented by $_RC_T$ should be equal to or greater than L. In the example described here, the values of T and L are known; T is four (the number of transfers) and L is 35, which is the number of lines, such as lines 514 of FIG. 5 that may include 35-bit-wide data path (35 separate lines) to concurrently transfer 32 data bits plus three of the 12 error information bits. Based on the known value of T and L, the number of rows R in can be calculated such that $_RC_T \exists L$. For example, from calculation, if R=7 (seven rows), then $_RC_4=35 \exists 35$. If R32 8, then $_RC_4=70$. Thus, if a row of portion 661 in matrix 660 is selected to be either R=7 ($_RC_4=35$) or R=8, it satisfies $_RC_4 \exists 35$. In creating matrix 660, R=8 is selected (although R=7 can be used), meaning that matrix 660 has eight rows in portion 661, shown in FIG. 6 as ROW 1 through ROW 8 in "ROW UPPER" section in portion 661. Although R=7 can be used, selecting R=8 rows instead of R=7, as described here, may provide symmetry in portion 661 of the matrix 660 and may simplify design of system 600. It is also the case, in various implementation shown here, that there are spaces for 12 error information bits, four of which are the bits in portion 662 of matrix 660 leaving room for 8 other EC bits.

The above description shows how the rows and columns of matrix 660 are selected. The following description shows how data bits of data information 650 and error information bits of error correction information 651 are assigned in the rows and columns of matrix 660.

Within each of the groups 0 through 31, each data bit belonging to the same group can be assigned to one of the columns within that group, such as $A_0$, $B_0$, $C_0$, and $D_0$ in the four columns in group 0. Then, the instance (e.g., instance $A_0$, $B_0$, $C_0$, and $D_0$) of the four data bits can be assigned to any four different rows among ROW 1 through ROW 8 in portion 661. The combination of the rows that contain the four instances of one group is selected to be unique relative to the row combinations of all other groups. For example, in group 0, the instance of $A_0$, $B_0$, $C_0$, and $D_0$ is assigned to ROW 1, ROW 2, ROW 3, and ROW 4. Thus, in this example, data bits belonging to group 0 are assigned to a combination of ROW 1, ROW 2, ROW 3, and ROW 4. In group 1, the instance of $A_1$, $B_1$, $C_1$, and $D_1$ is assigned to ROW 1, ROW 2, ROW 3, and ROW 5. Thus, in this example, data bits of group 1 are assigned to a combination of ROW 1, ROW 2, ROW 3, and ROW 5, which is different from the combination of ROW 1, ROW 2, ROW 3, and ROW 4 of group 0, which is also different from the row combination of group 2, which is ROW 1, ROW 2, ROW 3, and ROW 6.

Following the pattern above, the data bits of data information 650 can be assigned to columns and rows of matrix 660, such that data bits in each of the groups 0 through 31 are assigned to a unique combination of ROW 1 through ROW 8 in portion 661 of matrix 660. FIG. 6 shows only one example of the assignment of rows and columns of some of the groups 0 through 31. Other assignments may be created as long as the row combinations assigned to groups 0 through 31 are unique with respect to each other.

The unique row combination assigned to each of the groups 0 through 31 creates a unique signature or identification (ID) for each group within matrix 660. The unique ID of each group enables system 600 to identify a specific group if some specific errors occur in data information 650 and the error occurs in that group. The unique ID of any particular group corresponds to a unique combination of bits $EC_0$ through $EC_7$ that is associated with data bits of only that particular group, such that each bit of that particular group contributes to a corresponding bit of the unique combination of bits $EC_0$ through $EC_7$. For example, as shown in FIG. 6, the combination of bits $EC_0$, $EC_1$, $EC_2$, and $EC_3$ is associated only data bits $A_0$, $B_0$, $C_0$, and $D_0$ of group GRP 0, such that only data bits $A_0$, $B_0$, $C_0$, and $D_0$ contribute to the values of combination $EC_0$, $EC_1$, $EC_2$, and $EC_3$. In other examples, the combination of bits $EC_0$, $EC_1$, $EC_2$, and $EC_4$ is associated with the data bits (e.g., $A_1$, $B_1$, $C_1$, and $D_1$) of only group 1, and the combination of bits $EC_0$, $EC_1$, $EC_3$, and $EC_4$ is associated with the data bits (e.g., $A_5$, $B_5$, $C_5$, and $D_5$) of only group 5.

Control module 666 calculates the value of each of the error information bits $EC_0$ through $EC_{11}$ during a write or read operation based on data information 650. Control module 666 may logically combine (such as perform an exclusive OR logic operation) the values of data bits in all columns of the same row of matrix 660 to generate the value of the error information bit corresponding to that row. For example, as shown in ROW 1 in portion 661 of FIG. 6, control module 666 calculates the value of error information bit $EC_0$ based on all data bits of groups 0 through 5 in ROW 1, and also data bits of groups 6 through 29 in ROW 1 if any of groups 6 through 29 has an instance of its data bits assigned to ROW 1. As shown in ROW 4 in portion 661 of FIG. 6, control module 666 calculates the value of error information bit $EC_3$ based on all data bits of group 0, group 5, group 30, and also data bits of groups 6 through 29 in ROW 4 if any of groups 6 through 29 has an instance of its data bits assigned to ROW 4. As shown in ROW 8 in portion 661 of FIG. 6, control module 666 calculates the value of error information bit $EC_7$ based on all data bits of group 4, group 30, group 31, and also data bits of groups 6 through 29 in ROW 4 if any of groups 6 through 29 has an instance of its data bits assigned to ROW 4. As shown in ROW 1 in the "ROW LOWER" section in portion 662 of FIG. 6, control module 666 calculates the value of error information bit $EC_8$ based on all data bits $A_0$ through $A_{31}$ of each of the groups 0 through 31, and calculates the value of error information bit $EC_9$ based on all data bits $B_0$ through $B_{31}$ of each of the groups 0 through 31. When matrix 660 is implemented in system 600, locations without assignment of data bits are considered as empty or zero.

Control module 666 of system 600 may include components, such as logic components, to calculate the values of error information bits $EC_0$ through $EC_{11}$ based on the relationship between data information 650 and error correction information 651 of matrix 660. For example, control module 666 may include logic components described below with reference to FIG. 7 and FIG. 8.

Figure 7:
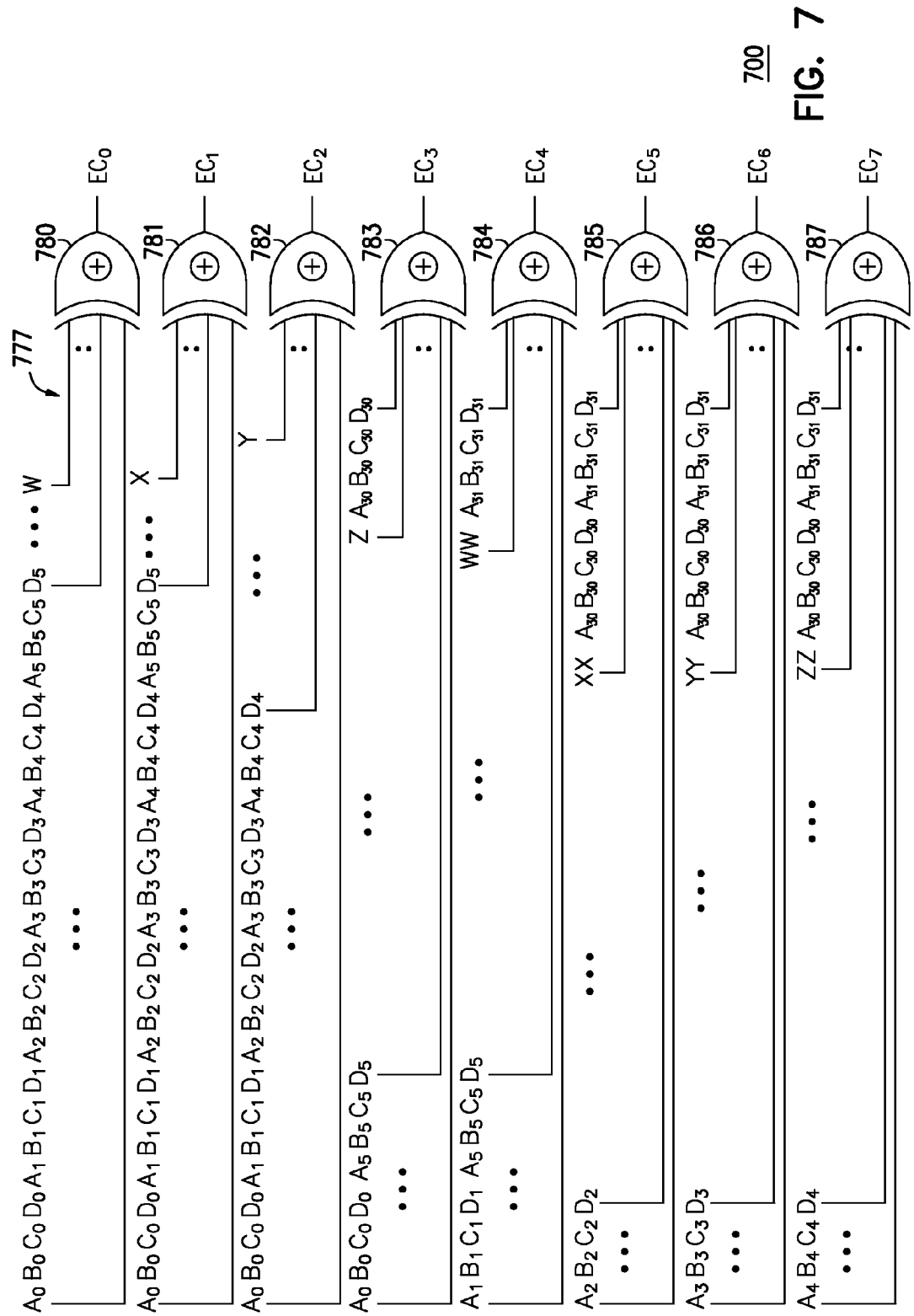
FIG. 7 and FIG. 8 show a partial block diagram of a system including a control module having logic components to generate values of error information bits, according to an embodiment of the invention.
Figure 8:
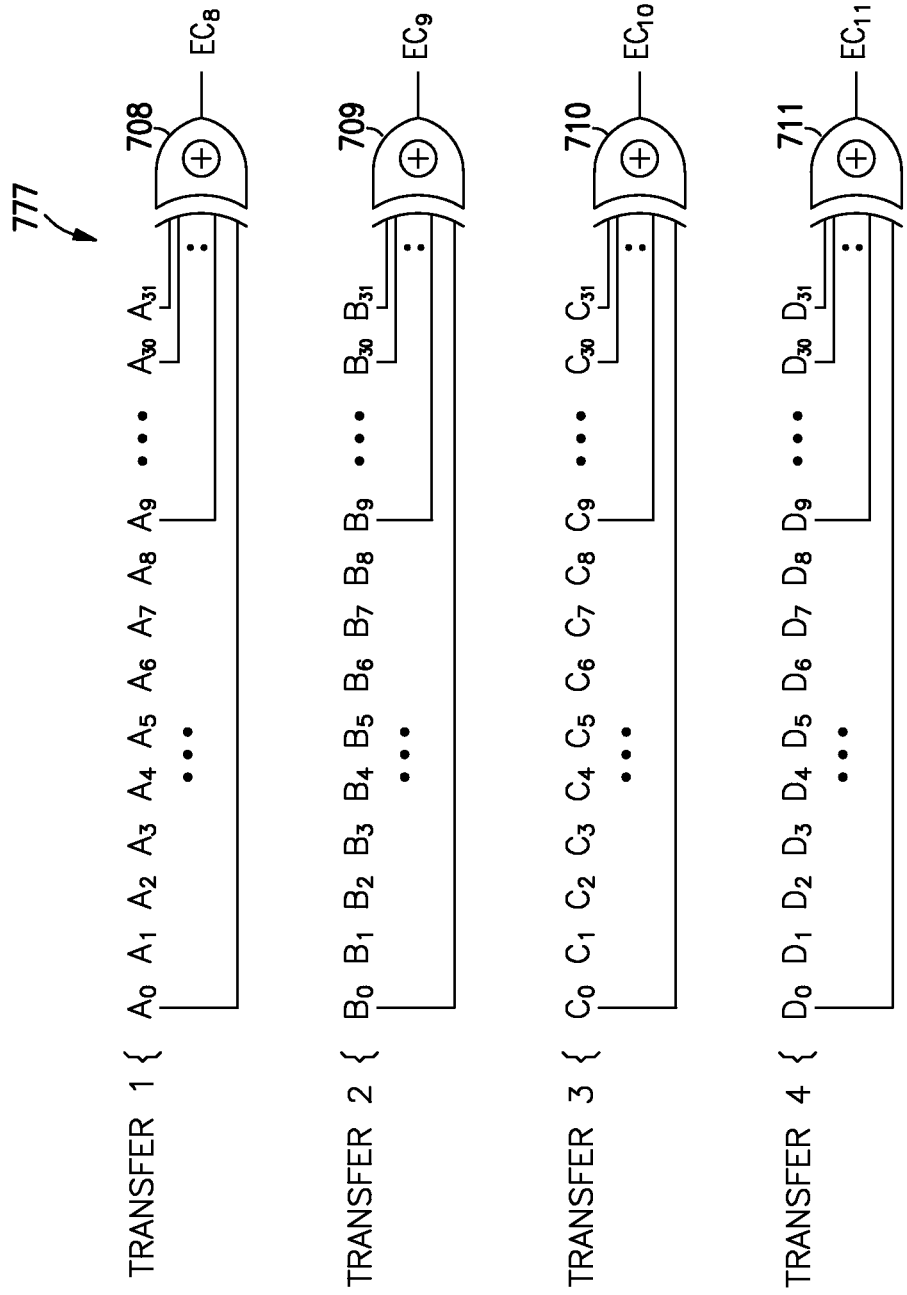

FIG. 7 and FIG. 8 show a partial block diagram of a system 700 including a control module 777 having logic components to generate values of error information bits $EC_0$ through $EC_{11}$, according to an embodiment of the invention. As shown in FIG. 7, control module 777 includes exclusive OR logic components (e.g., logic gates) 780 through 787. The data bits provided to inputs of each of exclusive OR logic components 780 through 787 correspond to data bits that are assigned to the same row in an upper portion of a matrix (similar to or identical to portion 661 of matrix 660 of FIG. 6). For example, data bits $A_0 \ldots D_5 \ldots$ and "W" at inputs of exclusive OR logic component 780 may correspond to a first row (e.g., ROW 1 in portion 661 of FIG. 6) of an upper portion of the matrix. Here, "W" represents an instance (if any) of data bits assigned to one group or instances (if any) of data bits assigned to two or more groups. For example, if one (or more) of the groups 6 through 29 in ROW 1 of portion of 661 of matrix 660 of FIG. 6 has an instance (or instances) of data bits, then "W" in FIG. 7 represents those data bits. If none of the groups 6 through 29 in ROW 1 of portion of 661 of matrix 660 of FIG. 6 has an instance of data bits, then "W" in FIG. 7 represents nothing (no data bit inputs at "W").

Similarly, depending on the data bit assignment in the matrix, "X", "Y", "Z", "WW", "XX", "YY", and "ZZ" at inputs of exclusive OR logic components 781 through 787 may or may not represent instances of data bits at the other rows (e.g., ROW 2 through ROW 8) of the upper portion of the matrix.

As shown in FIG. 8, control module 777 may also include exclusive OR logic components 708 through 711. The data bits provided to inputs of each of exclusive OR logic components 708 through 711 correspond to data bits that are assigned to the same row in a lower portion of the matrix (similar to or identical to portion 662 of matrix 660 of FIG. 6). For example, data bits $A_0$ through $A_{31}$ at inputs of exclusive OR logic component 708 may correspond to a first row (e.g., e.g., ROW 1 in portion 662 of FIG. 6) of a lower portion of the matrix. In another example, data bits $B_0$ through $B_{31}$ at inputs of exclusive OR logic component 709 may correspond to a second row (e.g., ROW 2 in portion 662 of FIG. 6) of the lower portion of the matrix.

A person skilled in the art will recognize that in FIG. 7 and FIG. 8, each of the exclusive OR logic components shown with such multiple inputs is only for ease of describing the embodiments herein. Each of the exclusive OR logic components in FIG. 7 and FIG. 8, however, can be implemented using a network of logic gates to perform intended logic functions, e.g., exclusive OR logic functions.

FIG. 7 and FIG. 8 show only a portion of control module 777 to concentrate on components that generate error information bits $EC_0$ through $EC_{11}$. Control module 777, however, can include components and functions similar to those of control module 111 (FIG. 1), control module 222 (FIG. 2 and FIG. 3), control module 555 (FIG. 5), or control module 666 (FIG. 6). For example, the components shown in FIG. 7 and FIG. 8 can be parts of units of control module 777 that are similar to write and read delivery units 206 and 306 of control module 222 of FIG. 2 and FIG. 3.

During a write operation of system 700, control module 777 stores both the data bits of the data information and the error information bits of the error correction information into a memory device of system 700. Similarly to the function of control module 222 of FIG. 2 and FIG. 3, during a read operation of system 700 of FIG. 7 and FIG. 8, control module 777 retrieves both the stored data bits the stored error information bits from the memory device of system 700. Control module 777 also generates new error correction information based on the retrieved data information. Then, control module 777 compares the new error correction information with the stored error correction information (that is retrieved in the read operation) to generate a comparison result (syndrome). Control module 777 may include a comparator and correction unit (not shown in FIG. 7 and FIG. 8 but can be similar to unit 326 of control module 222 of FIG. 3) to perform the comparison. Control module 777 then compares the comparison result with the IDs of the groups of the data information based on the matrix to determine whether an error has occurred and whether the error (if occurred) is correctable.

Figure 14:
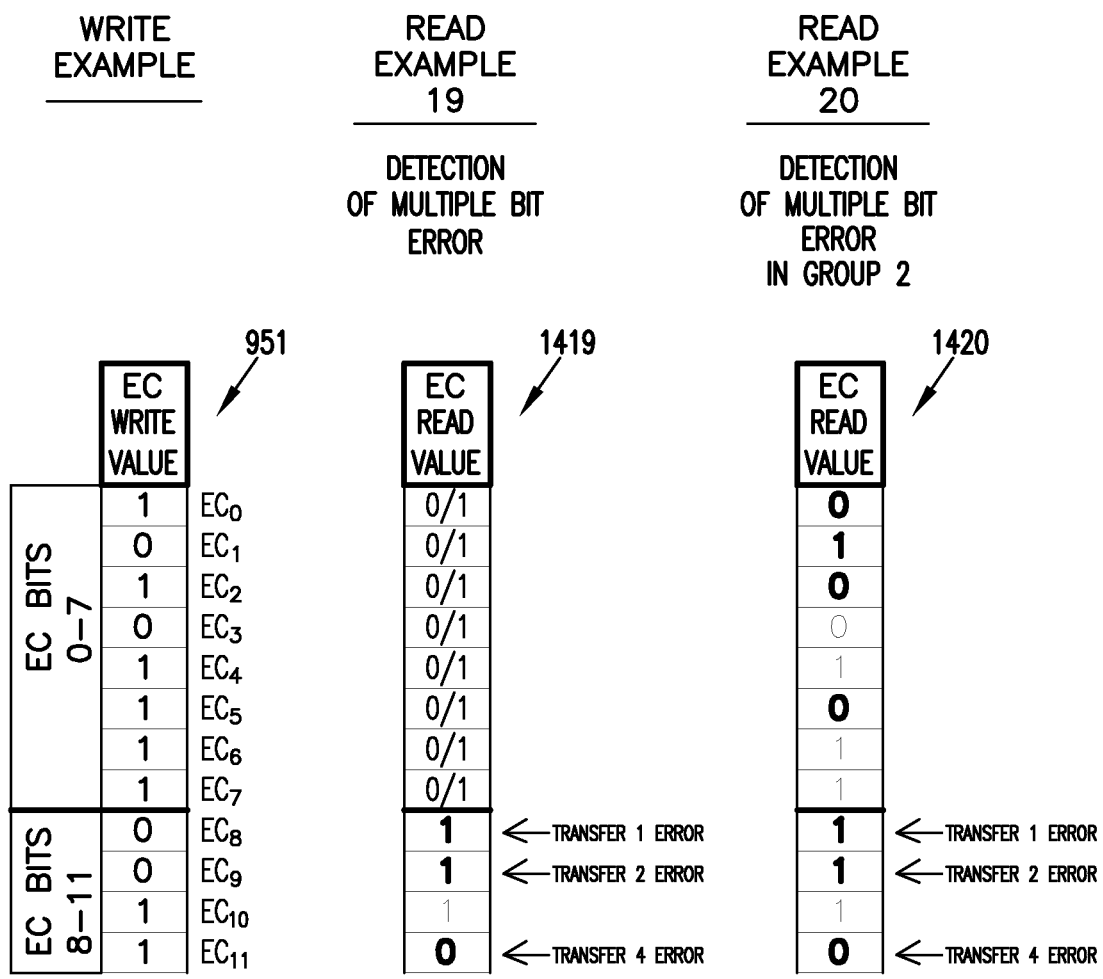
FIG. 14 shows various example values of read error correction information where an error is detected in an odd number of transfers of data information, according to an embodiment of the invention.

FIG. 9, FIG. 10, FIG. 11, and FIG. 12 show examples where an error is detected in a single transfer, such as in transfer 1, transfer 2, transfer 3, and transfer 4, respectively. FIG. 13 shows examples where an error is detected in an even number of transfers. FIG. 14 shows examples where an error is detected in an odd number of transfers in which the odd number is greater than one. For ease of discussion, FIG. 9 through FIG. 14 show examples related to only some of the groups 0 through 31. The system may detect or correct errors in the groups that are not discussed in these examples or in other examples in ways similar to those described below with reference to FIG. 9 through FIG. 14 or with reference to FIGS. 16 and 17.

Figure 9:
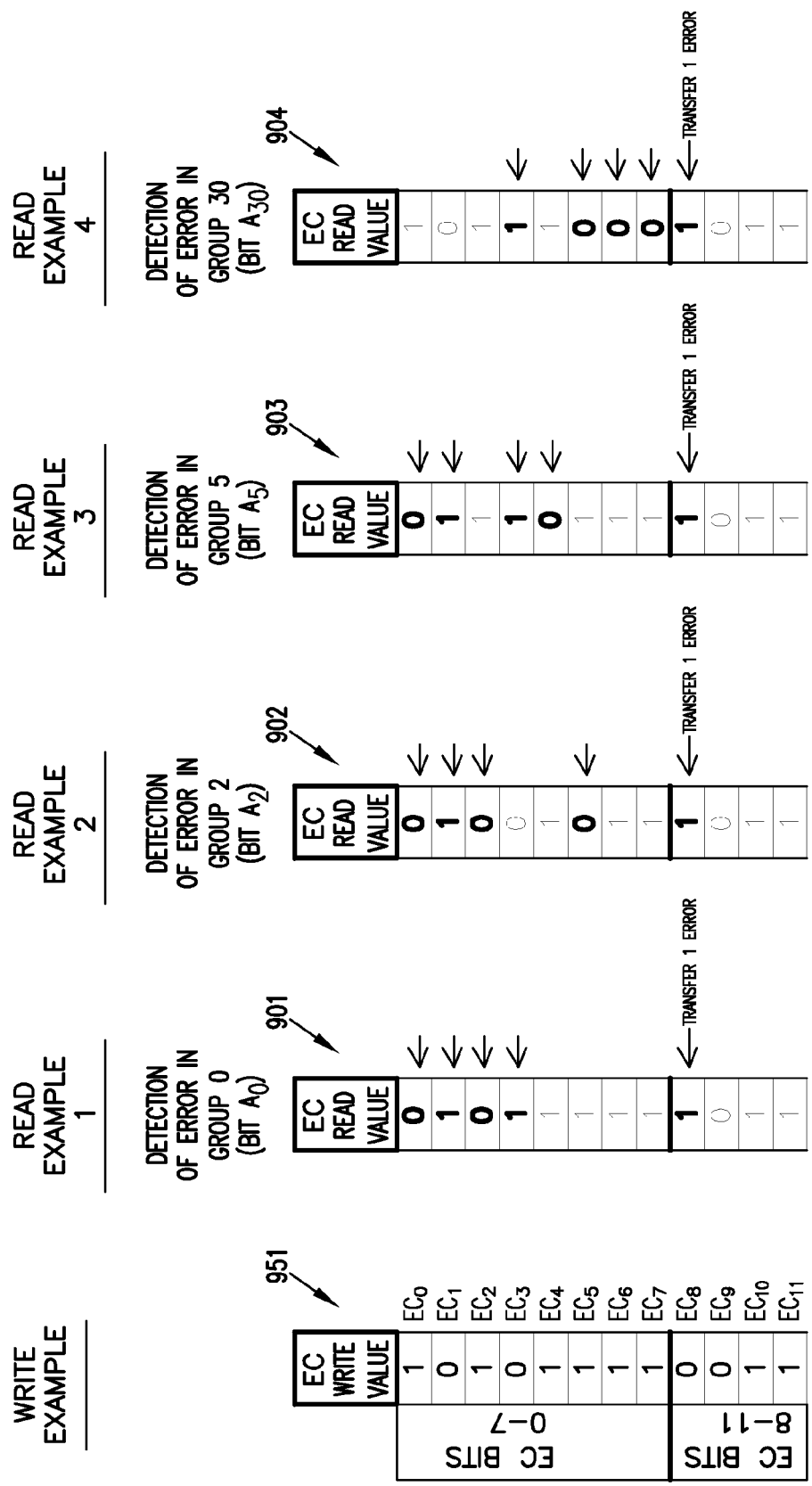
FIG. 9 shows an example value of write error correction information and various example values of read error correction information where a single-bit error is detected in a first transfer of data information, according to an embodiment of the invention.

FIG. 9 shows an example value of write error correction information 951 and various example values of read error correction information 901, 902, 903, and 904 where a single-bit error is detected in a first transfer of data information, according to an embodiment of the invention. In FIG. 9, the label "WRITE EXAMPLE" represents an example write operation in a system in which write error correction information (EC WRITE value) 951 is generated based on data information (such as data information 550 of FIG. 5) stored in a memory device of the system during the example write operation. The system described with reference to FIG. 9 may include the system described above with reference to FIG. 1 through FIG. 8. In FIG. 9, labels "READ EXAMPLE 1" through "READ EXAMPLE 4" represent different example read operations to read the data information that was stored in the memory device of the system during the example write operation. The read error correction information values (EC WRITE value) 901, 902, 903, and 904 correspond to possible values that may be generated based on the data information that is retrieved from the memory device of the system during the different example read operations.

The system described with reference to FIG. 9 may include components to implement a matrix, such as matrix 660 of FIG. 6, and use those components (e.g., exclusive OR logic components) to generate EC WRITE value 951 and EC READ values 901, 902, 903, 904, or 905 to and use these EC WRITE and EC READ values to detect errors that may occur in the data information during a read operation.

The following section discusses the write example and READ EXAMPLE 1; other read examples, such as READ EXAMPLE 2 through READ EXAMPLE 4, are discussed in later sections. As shown in FIG. 9, EC WRITE value 951 includes 12 error information bits $EC_0$ through $EC_{11}$, with eight bits $EC_0$ through $EC_7$ forming a portion of EC WRITE value 951, and four bits $EC_8$ through $EC_{11}$ forming another portion of EC WRITE value 951. Example values of bits $EC_0$ through $EC_{11}$ of EC WRITE value 951 are 1, 0, 1, 0, 1, 1, 1, 1, 0, 0, 1, 1 (generated from write data information during a write operation).

EC READ value 901 also includes 12 error information bits $EC_0$ through $EC_{11}$, with eight bits $EC_0$ through $EC_7$ forming a portion of EC READ value 901, and four bits $EC_8$ through $EC_{11}$ forming another portion of EC READ value 901. Example values of bits $EC_0$ through $EC_{11}$ of EC READ value 901 are 0, 1, 0, 1, 1, 1, 1, 1, 1, 0, 1, 1 (generated from read data information during a read operation).

The system compares bits $EC_8$ through $EC_{11}$ of EC WRITE value 951 with corresponding bits $EC_8$ through $EC_{11}$ of EC READ value 901 to detect errors that may occur in the data information retrieved during a read operation. As shown in FIG. 9, the value of bit $EC_8$ of EC WRITE 951 is "0", and the value of bit $EC_8$ of EC READ WRITE 901 is "1". The difference between the values of one of the bits in the portion having bits $EC_8$ through $EC_{11}$ of EC WRITE value 951 and EC READ value 901 indicates a detection of an error; either a single-bit error or a multiple-bit error may have occurred in the data information (read data information). Four bits $EC_8$ through $EC_{11}$ of EC WRITE value 951 and EC READ value 901 are used in this example for error detection, because the system uses four transfers to transfer data information and error correction information. If the system uses a different number (e.g., eight) of transfers to transfer data information and error correction information, then the system uses a different number (e.g., eight) of error information bits equal to the number (e.g., eight) of transfers for error detection.

As described in the above example, EC WRITE value 951 and EC READ value 901 have a value difference in bit $EC_8$ among four bits $EC_8$ through $EC_{11}$. Based on the data information and error correction information relationship in matrix 660 of FIG. 6 and based on the components of FIG. 8, bit $EC_8$ is associated with transfer 1. Thus, the error may have occurred in transfer 1 (as indicated in FIG. 9 as TRANSFER 1 ERROR). If the error is a single-bit error, one of data bits $A_0$ through $A_{31}$ of transfer 1 may be erroneous. In this case, the system can identify which one of the data bits $A_0$ through $A_{31}$ is erroneous and correct the error. If an even number of bits in $EC_8$ through $EC_{11}$ are different between the write value 951 and the read value (901 in this specific example), then the error is uncorrectable. If an odd number of bits in $EC_8$ through $EC_{11}$ are different between the write value 951 and the read value, then the data errors may be correctable, depending on the bit differences in the $EC_0$ through $EC_7$ values, as explained below. In the example of FIG. 9, the system determines whether the error is a correctable or uncorrectable error by comparing the portions that have eight error information bits $EC_0$ through $EC_7$ (check byte) of EC WRITE value 951 and EC READ value 901.

As shown in FIG. 9, bits $EC_0$ through $EC_7$ of EC WRITE value 951 have values of 1, 0, 1, 0, 1, 1, 1, 1, and bits $EC_0$ through $EC_7$ of EC READ value 901 have values of 0, 1, 0, 1, 1, 1, 1, 1. Thus, corresponding bits $EC_0$, $EC_1$, $EC_2$, and $EC_3$ of EC WRITE value 951 and EC READ value 901 have bit-to-bit value differences. Based on these differences in value, the system examines the assignments the groups relative to bits $EC_0$ through $EC_7$ based on the matrix (e.g., matrix 660 of FIG. 6) that was used to create bits $EC_0$ through $EC_7$ to determine whether the combination of bits $EC_0$, $EC_1$, $EC_2$, and $EC_3$ is assigned to any group (e.g. one of groups 0 through 31) in the matrix. If none of the assignments of groups matches the combination of bits $EC_0$, $EC_1$, $EC_2$, and $EC_3$, then the system identifies the error as uncorrectable, because multiple bits in the same transfer but in different groups may be erroneous. For example, two or more data bits $A_0$ through $A_{31}$ in two or more of groups 0 through 31 in transfer 1 are erroneous. In a multiple-bit error case, the system may issue an indication that the error is uncorrectable.

If the combination of bits having bit-to-bit value difference matches the assignment of only one of the groups and only one of bits $EC_8$ through $EC_{11}$ between an EC WRITE value and EC READ value has bit-to-bit value difference, then the system identifies the error as a single-bit error and corrects the erroneous bit. In this example, as shown in FIG. 6, the combination of bits $EC_0$, $EC_1$, $EC_2$, and $EC_3$ is assigned to only group 0. Thus, the system identifies data bit $A_0$ as erroneous and corrects it, for example, by changing (e.g., toggling) the value of data bit $A_0$ from "0" to "1" if data bit $A_0$ has a value of "0" (erroneous value) when it is retrieved during the read operation. In the opposite data scenario, the system changes the value of data bit $A_0$ from "1" to "0" if data bit $A_0$ has a value of "1" (erroneous value) when it is retrieved during the read operation. In this example, data bit $A_0$ is identified because, according to the matrix (e.g., matrix 660 of FIG. 6) as discussed above, error information bit $EC_8$ is assigned to transfer 1 in which bit $A_0$ of group 0 is transferred.

In the above example (READ EXAMPLE 1 in FIG. 9), if EC READ value 901 and EC WRITE value 951 have the same value, then the system determines that no errors have occurred and leaves the data information retrieved from the memory device unchanged. For example, if error information bits $EC_0$ through $EC_{11}$ of both EC READ value 901 and EC WRITE value 951 have the same values (e.g., 1, 0, 1, 0, 1, 1, 1, 1, 0, 0, 1, 1 (as shown in EC WRITE value 951), then the system identifies that no errors have occurred. If the values are different, indicating that an error is detected, then the system may examine the values of bits $EC_8$ through $EC_{11}$ of both EC READ value 901 and EC WRITE value 951. If only one bit is different between the 4-bit set $EC_8$ through $EC_{11}$ of EC READ value 901 and the 4-bit set $EC_8$ through $EC_{11}$ of EC WRITE value 951, then a single-bit error may have occurred. If there are no differences between the 4-bit set $EC_8$ through $EC_{11}$ of EC READ value 901 and the 4-bit set $EC_8$ through $EC_{11}$ of EC WRITE value 951, but there are differences in the $EC_0$ through $EC_7$ values, then an uncorrectable error may have occurred. If there are two, three, or four differences between the 4-bit set $EC_8$ through $EC_{11}$ of EC READ value 901 and the 4-bit set $EC_8$ through $EC_{11}$ of EC WRITE value 951, then a multiple-bit error may have occurred.

FIG. 9 also shows other example EC READ values 902, 903, and 904 that the system may generate during other example read operations, using the same write operation that generates EC WRITE value 951.

If EC READ value 902 is generated during a read operation and EC WRITE value 951 is generated during a write operation, the system may identify that a single-bit error or a multiple-bit error may have occurred in the data information, based on a value difference of only one error information bit ($EC_8$) in the lower portion that includes bits $EC_8$ through $EC_{11}$. Then, the system may further identify that the upper portion (bits $EC_0$ through $EC_7$) of EC READ value 902 (0, 1, 0, 0, 1, 0, 1, 1) and EC WRITE value 951 (1, 0, 1, 0, 1, 1, 1, 1) have bit-to-bit value difference between the combination of bits $EC_0$, $EC_1$, $EC_2$, and $EC_5$ of EC READ value 902 and the combination of bits $EC_0$, $EC_1$, $EC_2$, and $EC_5$ of EC WRITE value 951. Based on the matrix of FIG. 6, the system identifies that the combination of bits $EC_0$, $EC_1$, $EC_2$, and $EC_5$ is assigned to only group 2. Thus, in this example, the system identifies that a single-bit error may have occurred. Since data bit $A_2$ is transferred in transfer 1 of group 2 (based on the matrix), the system identifies data bit $A_2$ as erroneous and corrects it.

If EC READ value 903 is generated during a read operation and EC WRITE value 951 is generated during a write operation, the system may identify that a single-bit error or a multiple-bit error may have occurred in the data information, based on a value difference of only one error information bit ($EC_8$) in the lower portion that includes bits $EC_8$ through $EC_{11}$. Then, the system may further identify that the upper portion (bits $EC_0$ through $EC_7$) of EC READ value 903 (0, 1, 1, 1, 0, 1, 1, 1) and EC WRITE value 951 (1, 0, 1, 0, 1, 1, 1, 1) have bit-to-bit value difference between the combination of bits $EC_0$, $EC_1$, $EC_3$, and $EC_4$ of EC READ value 903 and the combination of bits $EC_0$, $EC_1$, $EC_3$, and $EC_4$ of EC WRITE value 951. Based on the matrix of FIG. 6, the system identifies that the combination of bits $EC_0$, $EC_1$, $EC_3$, and $EC_4$ is assigned only to group 5. Thus, in this example, the system identifies that a single-bit error may have occurred. Since data bit $A_5$ is transferred in transfer 1 of group 5 (based on the matrix), the system identifies that data bit $A_5$ as erroneous and corrects it.

If EC READ value 904 is generated during a read operation and EC WRITE value 951 is generated during a write operation, the system may identify that a single-bit error or a multiple-bit error may have occurred in the data information, based on a value difference of only one error information bit ($EC_8$) in the lower portion that includes bits $EC_8$ through $EC_{11}$. Then, the system may further identify that the upper portions (bits $EC_0$ through $EC_7$) of EC READ value 904 (1, 0, 1, 1, 1, 0, 0, 0) and EC WRITE value 951 (1, 0, 1, 0, 1, 1, 1, 1) have bit-to-bit value difference between the combination of bits $EC_3$, $EC_5$, $EC_6$, and $EC_7$ of EC READ value 903 and the combination of bits $EC_3$, $EC_5$, $EC_6$, and $EC_7$ of EC WRITE value 951. Based on the matrix of FIG. 6, the system identifies that the combination of bits $EC_3$, $EC_5$, $EC_6$, and $EC_7$ is assigned only to group 30. Thus, in this example, the system identifies that a single-bit error may have occurred. Since data bit $A_{30}$ is transferred in transfer 1 of group 30 (based on the matrix), the system identifies that data bit $A_{30}$ as erroneous and corrects it.

Figure 10:
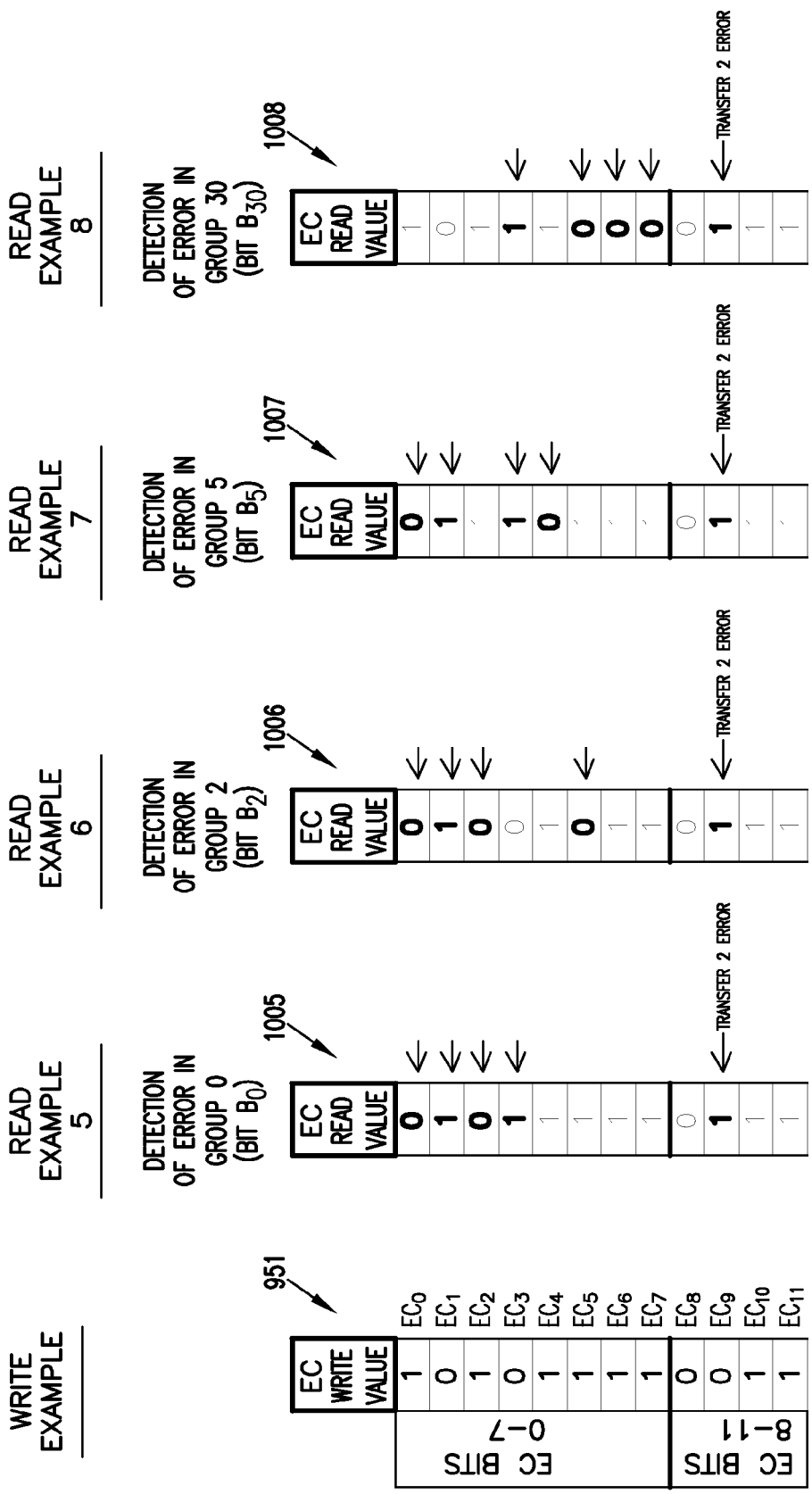
FIG. 10 shows various example values of read error correction information where a single-bit error is detected in a second transfer of data information, according to an embodiment of the invention.

FIG. 10 shows various example values of read error correction information where a single-bit error is detected in a second transfer of data information, according to an embodiment of the invention. The examples in FIG. 10 use the same EC WRITE values 951 (FIG. 9) but with different EC READ values 1005, 1006, 1007, and 1008. The difference between the examples of FIG. 9 and FIG. 10 is that the error in FIG. 10 is detected in a different transfer of the data information. In FIG. 9, transfer 1 has the error. In FIG. 10, however, transfer 2 has the error, as indicated by a difference in values in bit $EC_9$ between EC WRITE value 951 and each of EC READ values 1005, 1006, 1007, and 1008. In the examples of FIG. 9 and FIG. 10, the system detects and identifies the single-bit error and the group that has the error in similar fashions. In FIG. 10, however, since bit $EC_9$ is assigned to transfer 2 in which data bits $B_0$ through $B_{31}$ are transferred, the system identifies data bit $B_0$, $B_2$, $B_5$, or $B_{30}$ (depending on which group is identified, as shown in FIG. 10) as erroneous and corrects it.

Figure 11:
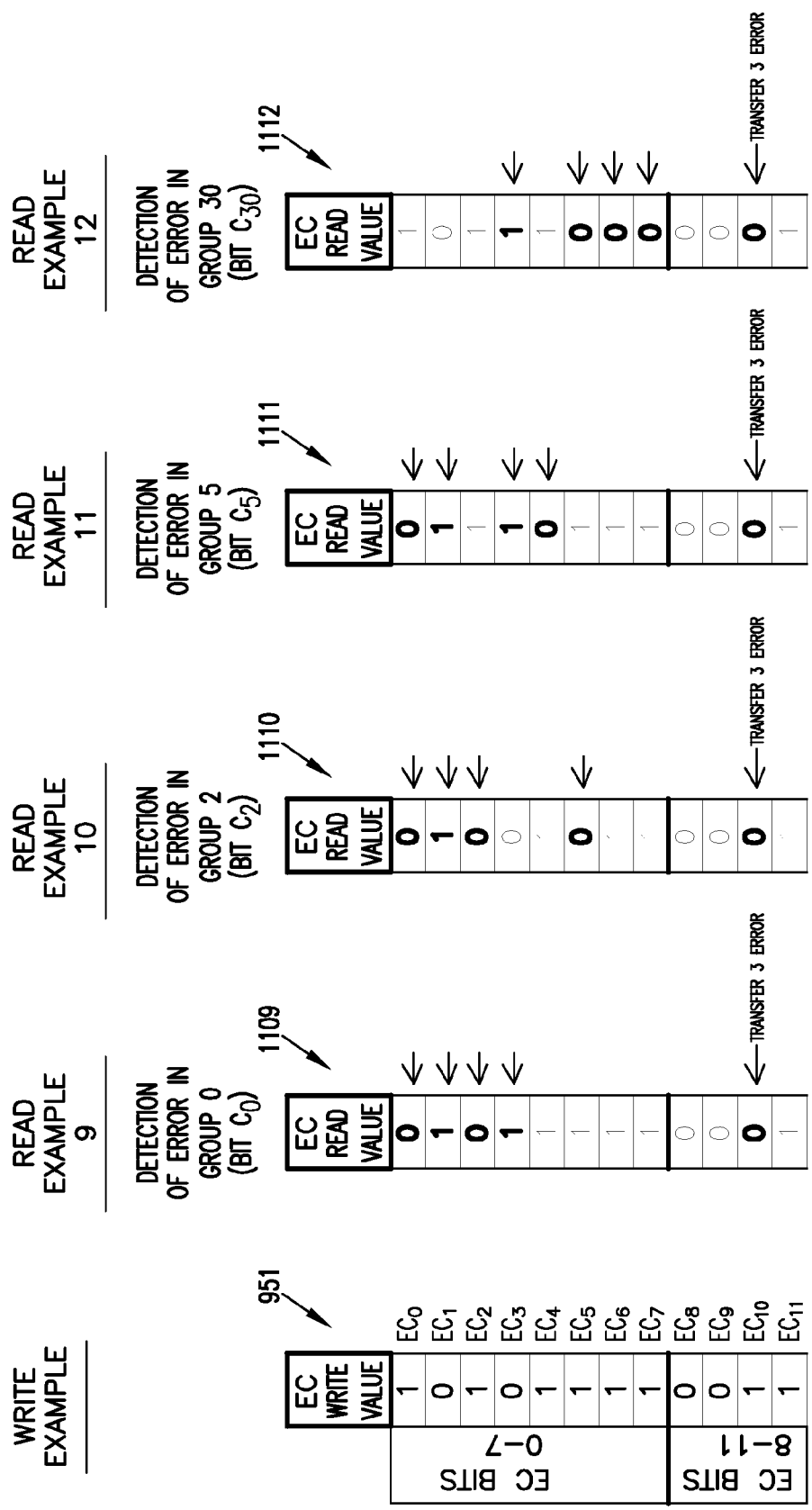
FIG. 11 shows various example values of read error correction information where a single-bit error is detected in a third transfer of data information, according to an embodiment of the invention.

FIG. 11 shows various example values of read error correction information where a single-bit error is detected in a third transfer of data information, according to an embodiment of the invention. The examples in FIG. 11 use the same EC WRITE values 951 (FIG. 9) but with different EC READ values 1109, 1110, 1111, and 1112. The difference between the examples of FIG. 9 and FIG. 11 is that in FIG. 11, transfer 3 has the error, as indicated by a difference in values in bit $EC_{10}$ between EC WRITE value 951 and each of EC READ values 1109, 1101, 1111, and 1112. In the examples of FIG. 9 and FIG. 11, the system detects and identifies the single-bit error and the group that has the error in similar fashions. In FIG. 11, however, since bit $EC_{10}$ is assigned to transfer 3 in which data bits $C_0$ through $C_{31}$ are transferred, the system identifies data bit $C_0$, $C_2$, $C_5$, or $C_{30}$ (depending on which group is identified, as shown in FIG. 11) as erroneous and corrects it.

Figure 12:
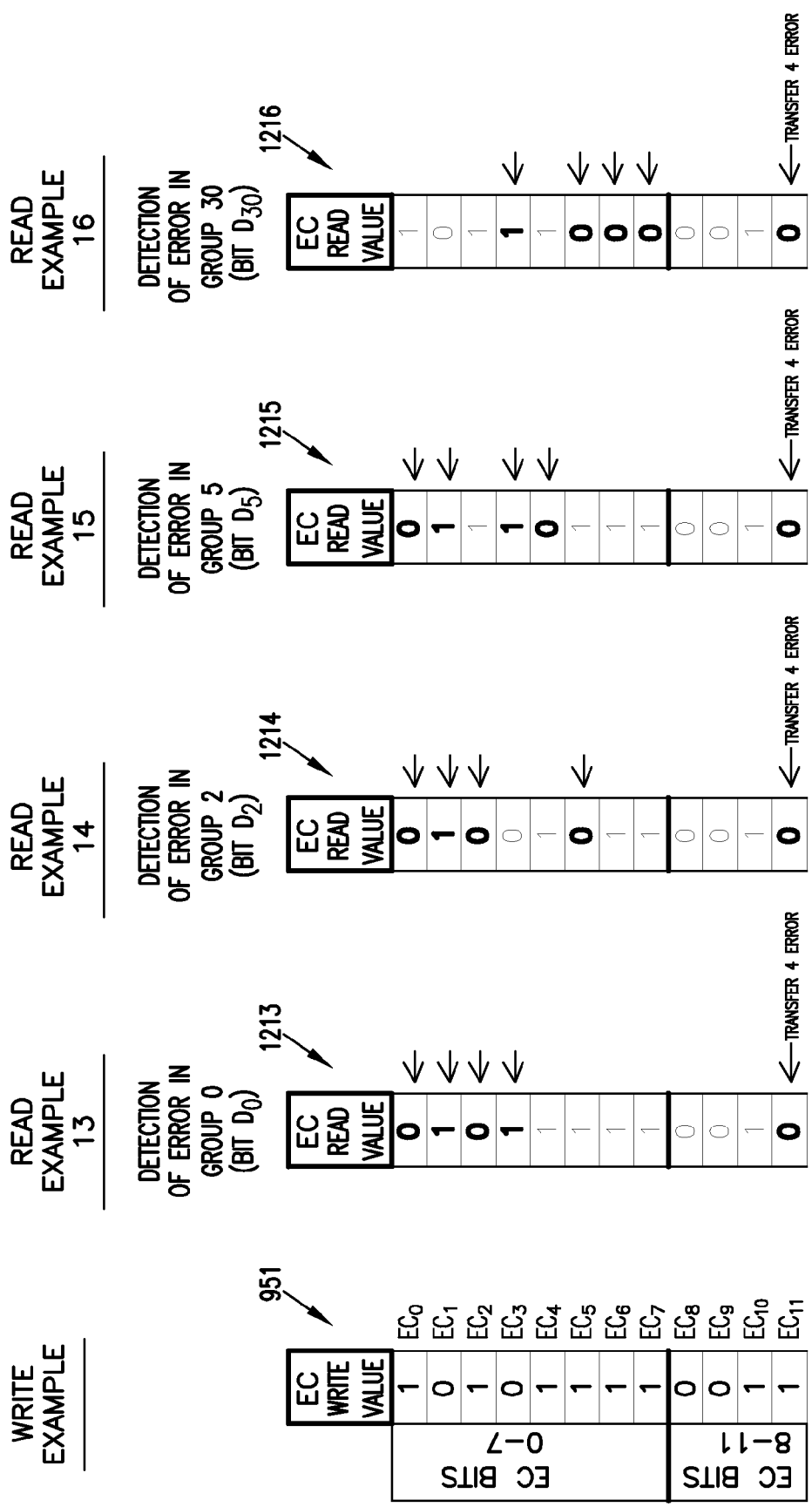
FIG. 12 shows various example values of read error correction information where a single-bit error is detected in a fourth transfer of data information, according to an embodiment of the invention.

FIG. 12 shows various example values of read error correction information where a single-bit error is detected in a fourth transfer of data information, according to an embodiment of the invention. The examples in FIG. 12 use the same EC WRITE values 951 (FIG. 9) but with different EC READ values 1213, 1214, 1215, and 1216. The difference between the examples of FIG. 9 and FIG. 12 is that in FIG. 12, transfer 4 has the error, as indicated by the difference in values in bit $EC_{11}$ between EC WRITE value 951 and each of EC READ values 1213, 1214, 1215, and 1216. In the examples of FIG. 9 and FIG. 12, the system detects and identifies the single-bit error and the group that has the error in similar fashions. In FIG. 12, however, since bit $EC_{11}$ is assigned to transfer 4 in which data bits $D_0$ through $D_{31}$ are transferred, the system identifies data bit $D_0$, $D_2$, $D_5$, or $D_{30}$ (depending on which group is identified, as shown in FIG. 12) as erroneous and corrects it.

FIG. 13 shows various example values of read error correction information where an error is detected in an even number of transfers of data information, according to an embodiment of the invention. The examples in FIG. 13 use the same EC WRITE values 951 (FIG. 9) but with different EC READ values 1317 and 1318. The difference between the examples of FIG. 9 and FIG. 13 is that in FIG. 13, multiple transfers have errors, such as an even number (two or four) transfers have error. Two transfers, such as transfers 2 and 3, have errors are indicated by the bit-to-bit value difference between bits $EC_9$ and $EC_{10}$ of EC READ value 1317 and bits $EC_9$ and $EC_{10}$ of EC WRITE value 951. Four transfers, such as transfers 1, 2, 3, and 4, have errors are indicated by the bit-to-bit value difference between bits $EC_8$, $EC_9$, $EC_{10}$, and $EC_{11}$ of EC READ value 1318 and bits $EC_8$, $EC_9$, $EC_{10}$, and $EC_{11}$ of EC WRITE value 951.

An error in an even number of transfers (e.g., two or four transfers in FIG. 13) indicates that a multiple-bit error has occurred. The system considers multiple-bit error associated with an even number of transfers, such as in the examples of FIG. 13, as uncorrectable. Thus, if a multiple-bit error is detected, as shown in the examples of FIG. 13, the system may issue an indication that the error is uncorrectable. In the multiple-bit error, the value of each of bits $EC_0$ through $EC_7$ may or may not result in a combination that matches the assignment of a single group. Even if the combination matches the assignment of a single group, the combination may be invalid. FIG. 13 shows the value of each of bits $EC_0$ through $EC_7$ as "0/1" to indicate that regardless of the values of each of these bits (whether "0" or "1"), the system may ignore the values bits $EC_0$ through $EC_7$ if the system detects (based on the values of bits $EC_8$ through $EC_{11}$) an even number of transfers of the data information have errors.

FIG. 14 shows various example values of read error correction information where an error is detected in an odd number of transfers of data information, according to an embodiment of the invention. The examples in FIG. 14 use the same EC WRITE values 951 of FIG. 13 but with different EC READ values 1419 and 1420. The difference between the examples of FIG. 13 and FIG. 14 is that FIG. 13 shows an even number of transfers having an error is detected and FIG. 14 shows an odd number of transfers having an error is detected.

In FIG. 14, the difference between EC READ value 1419 and EC READ value 1420 is that the values of bits $EC_0$ through $EC_7$ of EC READ value 1419 may not enable identifying a specific group among groups 0 through group 31. In contrast, in EC READ value 1420, the values of bits $EC_0$ through $EC_7$ enable identifying a specific group among groups 0 through 31.

An error in an odd number of transfers (e.g., three transfers in FIG. 14) indicates that a multiple-bit error has occurred. However, in this case, since the values of bits $EC_8$ through $EC_{11}$ indicate an odd number of erroneous data bits (as in the example of FIG. 14), the erroneous data bits may be corrected if the values of bits $EC_0$ through $EC_7$ identify a specific group among groups 0 through 31.

In multiple-bit error cases, such as in the examples of FIG. 14, the value of each of bits $EC_0$ through $EC_7$ may or may not result in a combination that matches the assignment of a single group. FIG. 14 shows the value of each of bits $EC_0$ through $EC_7$ in EC READ value 1419 as "0/1" to indicate an example where bit-to-bit comparisons between corresponding bits $EC_0$ through $EC_7$ of EC WRITE value 951 and EC READ value 1419 do not result in a combination that matches the assignment of a single group. However, comparisons between corresponding bits $EC_0$ through $EC_7$ of EC WRITE value 951 and EC READ values 1420 result in a combination that matches the assignment of a single group.

For example, bits $EC_0$ through $EC_7$ of EC WRITE value 951 have values of 1, 0, 1, 0, 1, 1, 1, 1, and bits $EC_0$ through $EC_7$ of EC READ value 1420 have values of 0, 1, 0, 1, 1, 1, 1, 1. Thus, bits $EC_0$, $EC_1$, $EC_2$, and $EC_3$ of EC WRITE value 951 and bits $EC_0$, $EC_1$, $EC_2$, and $EC_3$ of EC READ value 1420 have bit-to-bit value differences. Based on these bit-to-bit value differences, the system identifies that the combination of bits $EC_0$, $EC_1$, $EC_2$, and $EC_3$ is assigned to group 0 in matrix 660 of FIG. 6. Thus, in this case, the system determines that a multiple-bit error having multiple erroneous data bits has occurred in which the multiple erroneous data bits belong to only group 0. Since a specific group has been identified along with an odd number of erroneous data bits, the erroneous data bits may be corrected.

In FIG. 14, EC READ value 1420 also enables identifying that an odd number of erroneous data bits may have occurred in group 0 because the bit-to-bit value difference between bits $EC_8$, $EC_9$, and $EC_{11}$ of EC WRITE value 951 and bits $EC_8$, $EC_9$, and $EC_{11}$ of EC READ value 1420 indicate that three different transfers (e.g., TRANSFERS 1, 2, and 4 in FIG. 5) have errors. Using the example of FIG. 5 where group 0 has data bits $A_0$, $B_0$, $C_0$, and $D_0$ being transferred in TRANSFERS 1, 2, 3, and 4, respectively, the odd number (three) of erroneous data bits are bits $A_0$, $B_0$, and $D_0$.

FIG. 14 shows an example where an odd number of multiple erroneous data bits belong to a specific group is three. In some systems or devices, each group may include eight or more data bits. Thus, in these systems, the error correction information may also enable identifying a specific group if an error having odd an number of three, five, seven, or other odd number greater than seven multiple erroneous data bits has occurred and the multiple erroneous data bits belong to only that specific group.

Some conventional systems or devices may sometimes improperly detect (e.g., misidentify or ignore) or wrongly correct an error that has only an odd number of multiple erroneous data bits, such as the one described in the example associated with EC READ value 1420 in FIG. 14. Improper detection or correction of error in some conventional systems may lead to corrupted data information and potential system malfunction.

In the systems described herein, however, proper detection of an error, such as the one described in the example associated with EC READ value 1420 in FIG. 14, may prevent misidentifying or prevent ignoring, or both, of multiple-bit errors, thereby avoiding improper correction of errors or preventing the occurrence of corrupted data information or potential system malfunction.

As described above, a system or a device may have a number of groups with M data bits in each group. M is an integer greater than one and can be either an odd or even number. The system or the device transfers the M data bits of each group on a separate line of the system or device. M can also be the number of data errors due to a single actual failure; in the examples here with data being multiplied 4 ways (128 data bits sent in 4 transfers of 32) a single line failure can cause up to 4 data errors. The error correction information generated based on the description herein may enable the system or device to identify a specific group among the groups if an error having multiple erroneous data bits has occurred and if multiple erroneous data bits belong to only that specific group. The total number of the multiple erroneous data bits can be either an odd number or an even number. If the total number of erroneous data bits is an odd number, it can be greater than one and at most equal to M. If more than M bits are actually erroneous, aliasing/cancellation will occur to make the resultant syndrome indicate fewer bits in error, e.g., ≤M bits. If the total number of erroneous data bits is an even number, it can be greater than one and at most equal to M. Multiple-bit errors that have only an odd number of erroneous data bits a single group can be corrected.

Figure 15:
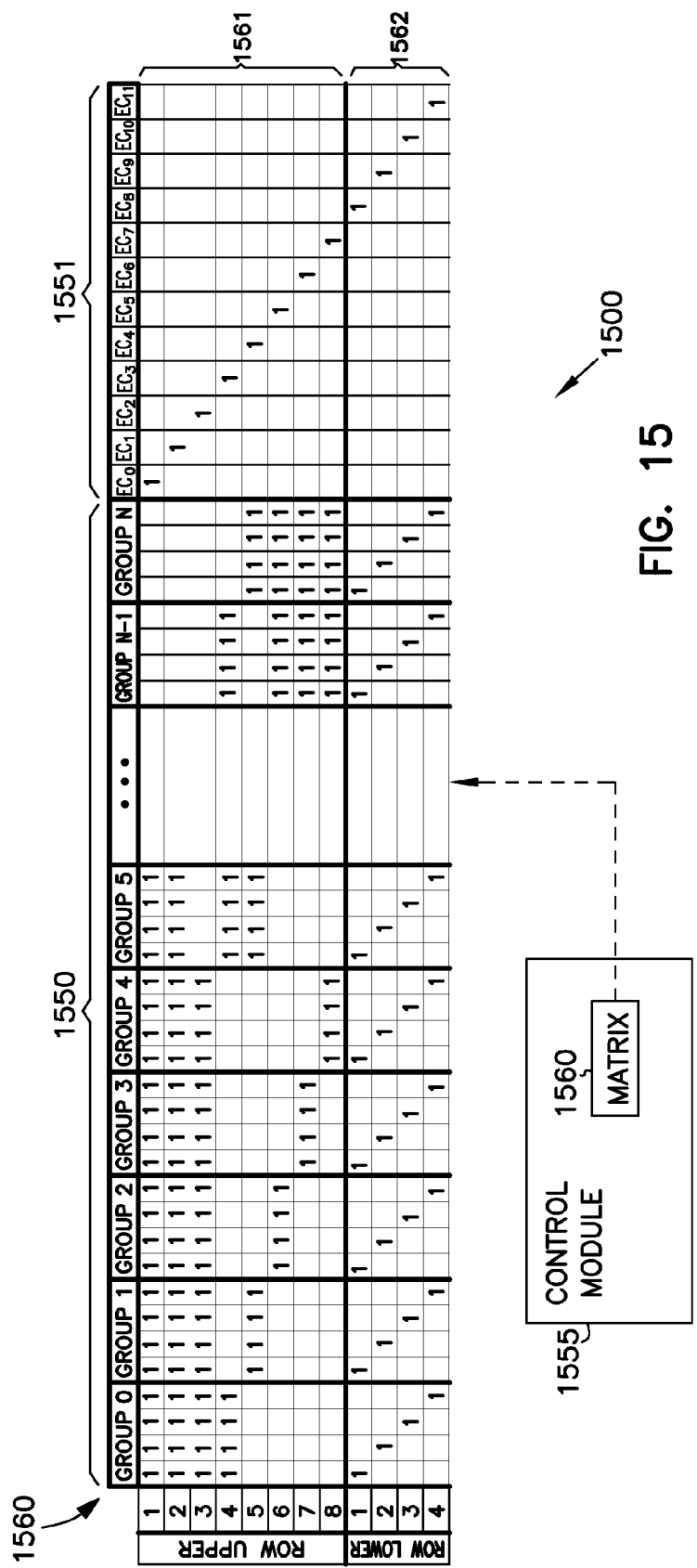
FIG. 15 shows a partial block diagram of a system including a control module to implement a matrix with general organization of data information, according to an embodiment of the invention.

FIG. 15 shows a partial block diagram of a system 1500 including a control module 1555 to implement a matrix 1560 with general organization of data information, according to an embodiment of the invention. Matrix 1560 may be created in ways similar to those of matrix 660 of FIG. 6, except that some specific data bit assignments and values in matrix 660 are replaced with some general data bit assignments. For example, as shown in FIG. 15, system 1500 may organize data information 1560 into four subset and N groups, where N is the number of the groups and the total number of data bits of data information 1550 is equal to the product of N and the number of columns in each group. As an example, N is equal to 32 in matrix 660 of FIG. 6. FIG. 15 shows each groups has four columns as an example. The number of columns may vary. FIG. 15 shows matrix 1560 to illustrate that a matrix similar to matrix 660 (FIG. 6) may be created in ways similar to those described above with reference to FIG. 6, so that a matrix different from matrix 660 can also be created for use in a system or device that has data bit organization and grouping different from those used in the systems or device that uses matrix 660.

In FIG. 15, each column in portion 1550 corresponds to a separate data bit. Each column in portion 1551 corresponds to a separate error information bit. A 1-bit in a row of portion 1550 indicates that the respective data bit contributes to the final value (sum) of the error information bit identified by the 1-bit in portion 1551.

As shown in FIG. 15, data bits in each of the groups 0 through N−1 are assigned to a unique combination of ROW 1 through ROW 8 in portion 1561 of matrix 1560. FIG. 15 shows an example of matrix 1560 with a specific row combination for each group. However, other assignments may be used as long as the row combination assigned to each of the groups 0 through N−1 is unique among each other and the number of one-bits in each group is always the same and follows the "$_RC_T\exists L$" rule given previously.

The unique row combination in portion 1561 assigned to each of the groups 0 through N−1 of data information 1550 creates a unique ID to enable system 1500 to identify a specific group if some specific errors occur in data information 1550 and the error occurs in that group.

For example, based on matrix 1560, the data bits of group 0 are assigned to ROW 1, 2, 3, and 4 of portion 1561, not assigned to ROW 5, 6, 7, and 8 of portion 1562. As shown in FIG. 15, ROW 1, 2, 3, and 4 of portion 1561 are assigned to error information bits $EC_0$, $EC_1$, $EC_2$, and $EC_4$. Thus, group 0 has an ID of 11110000. In a similar pattern, group 1 has an ID of 11101000, and group N−1 has an ID of 00001111. In portion 1562, the first bit of each group is assigned to the first row of portion 1562, with succeeding bits of each group assigned to successive rows of portion 1562.

In some cases, the groups of data information 1550 may be arranged such that matrix portions 1550/1561 can have a symmetrical structure. For example, if system 1500 organizes 128 bits of data information 1550 into four subsets of 32 bits each, and error correction information 1551 has 12 bits (as shown in FIG. 15), matrix 1560 can be created such that groups 0 through N−1 may be symmetrically arranged in portion 1561. For example, as shown in FIG. 15, each column in portion 1561 of group 0 has a matrix value of 11110000 (or 0xF0), and each column in portion 1561 of group N−1 has a matrix value of 00001111 (or 0x0F), which is symmetrical (a bit reversal) to 0xF0 of group 0. Each column in portion 1561 of group 1 has a value of 11101000 (or 0xE8) in portion 1561, and each column in portion 1562 of group N−2 has a matrix value of 00010111 (or 0x17), which is symmetrical to 0xE8 of group 1, and so on. A symmetrical matrix may allow similar loading and inputs for components (e.g., logic circuitry) that implement the matrix.

Figure 16:
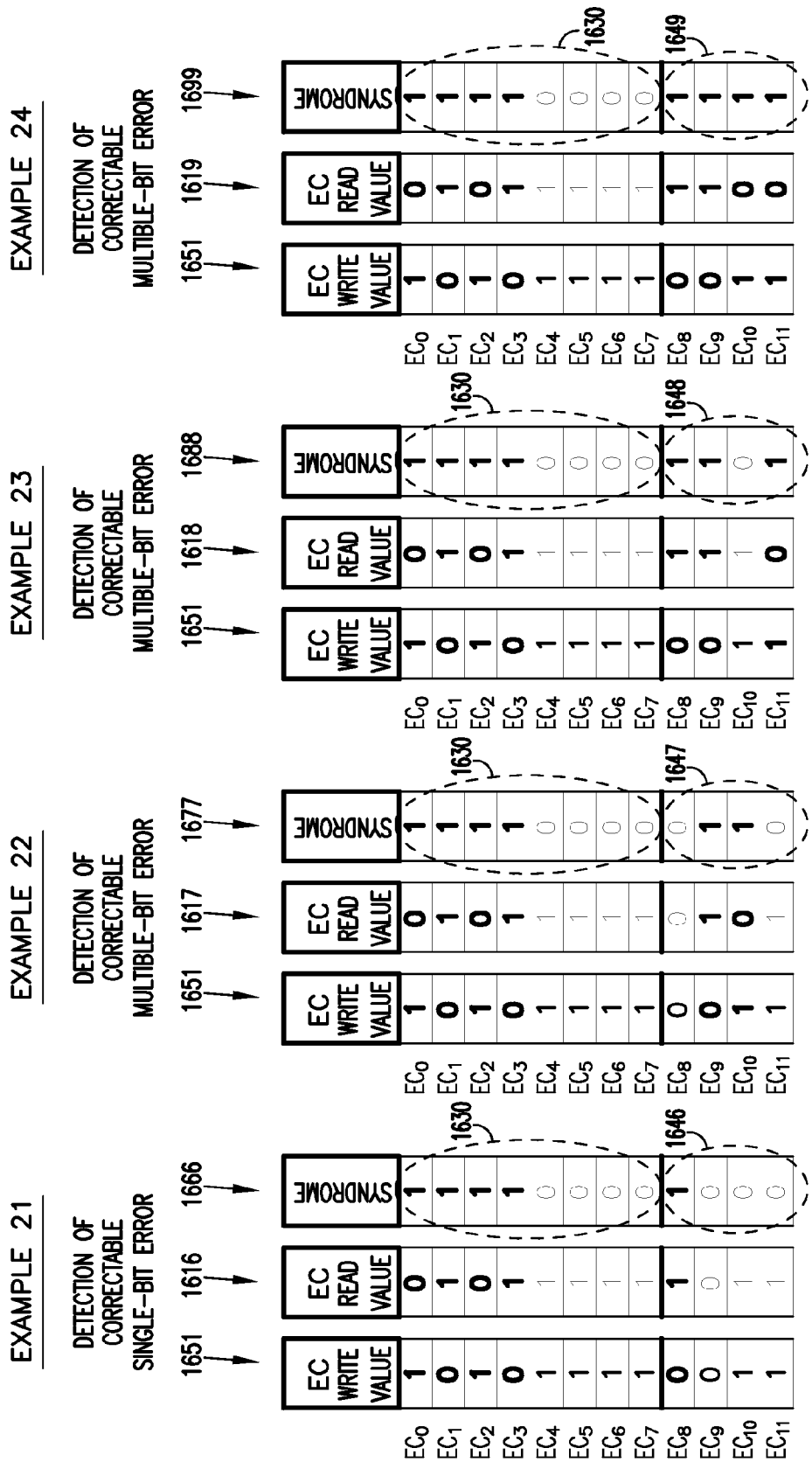
FIG. 16 shows different example values of different syndromes calculated from values of a write error correction information EC WRITE value and different read error correction information EC READ values, according to an embodiment of the invention.

FIG. 16 shows different example values of different syndromes 1666, 1677, 1688, and 1699 calculated from values of a write error correction information EC WRITE value 1651 and different read error correction information EC READ values 1616, 1617, 1618, and 1619, according to an embodiment of the invention. The system described with reference to FIG. 16 may include components to implement matrix 1560 of FIG. 15 to detect and identify erroneous bits.

The value of syndrome 1666, 1677, 1688, or 1699 in FIG. 16 enables the system to prevent at least one of misidentifying and ignoring multiple-bit errors if the multiple-bit errors include a plurality of erroneous data bits that belong to only one specific group of the plurality of groups and if none of the other groups of the plurality of groups have errors. For example, if a multiple-bit error include an odd total number of erroneous data bits that belong to only one specific group and if none of the other groups of the plurality of groups have errors, the system can correctly detect such multiple-bit error. In this example, based on the value of the syndrome, the system can also identify the identification of that specific group and may correct the error.

In FIG. 16, syndrome 1666 is calculated based on a bit-to-bit comparison between the values of the bits of EC WRITE value 1651 and EC READ value 1616. Thus, since each of EC WRITE value 1651 and EC READ value 1616 has 12 bits, syndrome 1666 also has 12 bits. The system may perform a bit-to-bit exclusive OR operation on bits $EC_0$ through $EC_{11}$ of WRITE value 1651 and EC READ value 1616 to calculate the value of the corresponding bit in syndrome 1666.

If all of the bits of syndrome 1666 are "0", then the system determines that no error has occurred in the data information. However, FIG. 16 shows an example where the values of all bits of syndrome 1666 are not "0" but they have a value of 1111000 in portion 1630 (corresponding to bits $EC_0$ through $EC_7$) and a value of 1000 in portion 1646 (corresponding to bits $EC_8$ through $EC_{11}$). In this example, the value "1" of bit $EC_8$ of portion 1646 of syndrome 1666 indicates that an error in the data information is detected. In response to this detection, the system examines portion 1630 of syndrome 1666 and the IDs of the groups that are assigned using matrix 1560 to determine whether the value of portion 1630 corresponds to an ID of only one of the groups. If it does, then syndrome 1666 identifies the error as a single-bit error and corrects it. A single-bit error is identified by a syndrome having only one "1" in portion 1646. If the value of portion 1630 does not correspond to an ID of only one of the groups, then the system may issue an indication that the error is uncorrectable.

In the example of syndrome 1666, the value (11110000) in portion 1630 corresponds to the ID of only group 0 (11110000). Thus, the system identifies the error occurred in group 0 and identifies that the data bit (e.g., $A_0$ in matrix 660), in column 1 (based on the value of "1" of bit $EC_8$ in portion 1646) of group 0 is erroneous and corrects it.

Each of syndromes 1677, 1688, and 1699 shows a multiple-bit error has occurred. The system may calculate syndromes 1677, 1688, and 1699 in a fashion similar to that used to calculate syndrome 1666. As described above with reference to FIG. 9 through FIG. 15, the system considers a multiple-bit error of an even number of erroneous data bits, indicated by bits such as bits $EC_8$ through $EC_{11}$, as uncorrectable. Thus, in the examples of FIG. 16 where a multiple-bit error of an even number of erroneous data bits is detected, the system leaves the data information unchanged and issues an indication that the error is uncorrectable. However, based on the syndrome, such as syndromes 1677, 1688, and 1699, if a multiple-bit error of an odd number of erroneous data bits is detected and if the odd number of erroneous data bits belong to only one specific group (as shown in syndrome 1688), the system can correct the erroneous data bits. Alternatively, the system may leave the correctable erroneous data bits uncorrected and issue and issue an uncorrectable or corrupted data indication.

The system may determine that a multiple-bit error has occurred if a portion of a syndrome, such as portion 1647, 1648, or 1649 of FIG. 16, has a number (either odd or even) of multiple bits with the same value, such as "1". As shown in FIG. 16, portion 1647 has bits $EC_9$ and $EC_{10}$ with the same value "1", portion 1648 has bits $EC_8$, $EC_9$, and $EC_{11}$ with the same value "1", and portion 1649 has bits $EC_8$, $EC_9$, $EC_{10}$, and $EC_{11}$ with the same value "1". Thus, based on the values of the bits in portions 1647, 1648, or 1649, the system may determine that a multiple-bit error has occurred in data information associated with syndromes 1677, 1688, and 1699.

Figure 17:
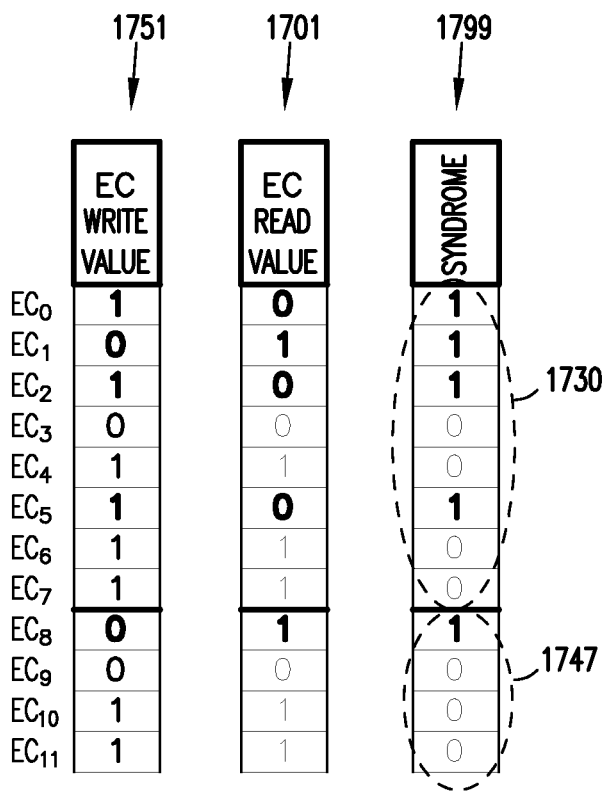
FIG. 17 shows an example value of a syndrome calculated from values of write error correction information and read error correction information, according to an embodiment of the invention.

FIG. 17 shows an example value of a syndrome 1799 calculated from values of a write error correction information EC WRITE value 1751 and a read error correction information EC READ value 1701, according to an embodiment of the invention. EC WRITE value 1751 and EC WRITE value 1651 (FIG. 16) have the same value. However, EC READ value 1701 in FIG. 17 is different from EC READ value 1616 of FIG. 16. Therefore, syndrome 1799 of FIG. 17 has a value that is different from the value of syndrome 1666 of FIG. 16. For example, portion 1630 of FIG. 16 has a value of 11110000, which is different from the value of 11100100 of portion 1730 FIG. 17.

Similarly to the example of FIG. 16, the value "1" of bit $EC_8$ of portion 1747 of syndrome 1799 indicates that an error in the data information is detected. Based on the value of 11100100 in portion 1730 of syndrome 1799, the system identifies that value 11100100 corresponds to the ID of only group 2. The system also identifies that first data bit (e.g., $A_2$ in matrix 660), in column 1 (based on the value of "1" of bit $EC_8$ of portion 1747) of group 2 is erroneous and corrects it.

In some situations, if the syndrome has only one bit with a value of "1" and all other bits are "0", such as "000000001000" (e.g., one "1" among bits $EC_8$ through bits $EC_{11}$) or "000001000000" (e.g., one "1" among bits $EC_0$ through bits $EC_7$) or some other combination with only one bit having a value of "1", the system may identify that no errors have occurred to the data bits of the data information but an error may have occurred to only one of the error information bits, when the error information bits were retrieved from the memory device during a read operation. In these situations, the system may ignore the error identified by the syndrome and leave the data information read from the memory unchanged and consider the data information as valid.

In other situations, the system described herein may sometimes misidentify or mis-correct a multiple-bit error. For example, the system may misidentify or mis-correct a multiple-bit error if two or more erroneous bits from two or more groups in the same row occur.

In a system or a device, such as the system or device described herein, the probability of an occurrence of a multiple-bit error is very small. Therefore, the probability of the system misidentifying or mis-correcting a multiple-bit error, as mentioned above, is also very small such that it can generally be ignored.

Figure 18:
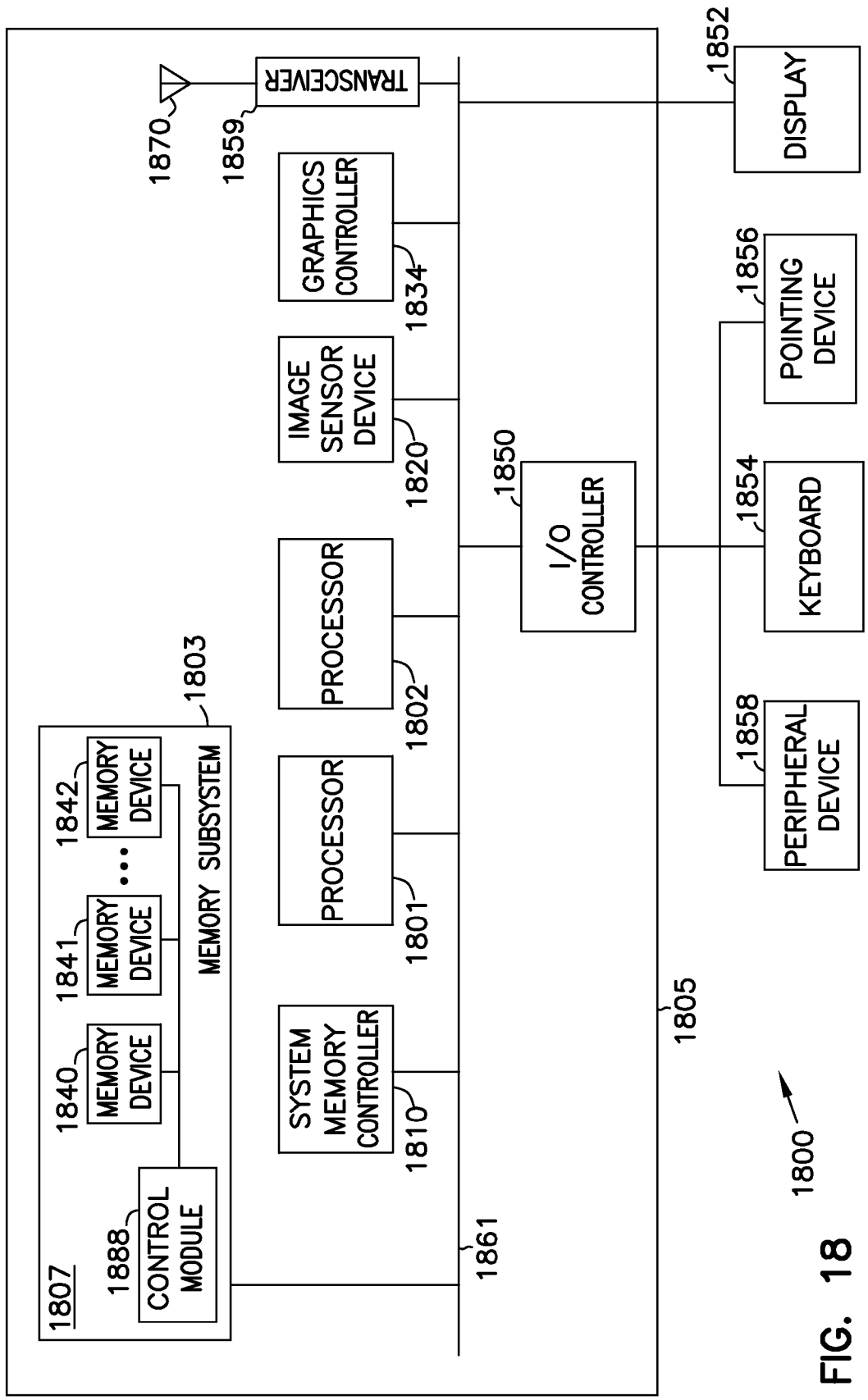
FIG. 18 shows a system including a memory subsystem, according to an embodiment of the invention.

FIG. 18 shows a system 1800, according to an embodiment of the invention. System 1800 includes processors 1801 and 1802, a memory subsystem 1803, an image sensor device 1820, a system memory controller 1810, a graphics controller 1834, an input and output (I/O) controller 1850, a display 1852, a keyboard 1854, a pointing device 1856, a peripheral device 1858, a system transceiver 1859, and antenna 1870 to wirelessly transmit and receive information to and from system 1800. System 1800 may also include a bus 1861 to transfer information among the components of system 1800, and a circuit board 1805 (e.g., motherboard) where some of the components of system 1800 are attached. Depending on its application, system 1800 may omit some of the components shown in FIG. 18 or may add more components.

One or both of processors 1801 and 1802 may include a general-purpose processor, an application specific integrated circuit (ASIC), or other types of processors. Depending on its application, system 1800 may omit one of processors 1801 and 1802. One or both of processors 1801 and 1802 may include a single core processor or a multi-core processor. One or both of processors 1801 and 1802 may execute one or more programming commands to process data and other information. The information includes information provided by system memory controller 1810 or other components of system 1800.

Image sensor device 1820 includes a complementary metal-oxide-semiconductor (CMOS) image sensor having a CMOS pixel array or charge-coupled device (CCD) image sensor having a CCD pixel array.

Memory subsystem 1803 includes a control module 1888 and memory devices 1840, 1841, and 1842. FIG. 18 shows an example where control module 1888 and memory devices 1840, 1841, and 1842 are enclosed in the same IC package 1807, in which control module 1888 and memory devices 1840, 1841, and 1842 may be arranged in stack configuration vertically from a board of the IC package. Alternatively, control module 1888 and memory devices 1840, 1841, and 1842 may be scattered in different locations in system 1800. Further, at least a portion of control module 1888 or the entire control module 1888 may also be included in system memory controller 1810 or in one or both of processors 1801 and 1802.

Memory subsystem 1803 includes various embodiments of the components described herein. For example, memory subsystem 1803 includes at least a portion of the system described herein, such as the control module described above with reference to FIG. 1 through FIG. 17. Thus, control module 1888 of FIG. 18 may generate error correction information associated with groups of data bits of data information during write and read operations and may calculate a syndrome based on the error correction information to enable correction of a single-bit error and detection of a multiple-bit error in the data information in system 1800. The syndrome may also enable control module 1888 to identify a specific group among the groups if a multiple-bit error having only an odd number of multiple erroneous data bits belonging the specific group is detected. Control module 1888 may correct the odd number of erroneous data bits that belong the specific group. Alternatively, control module 1888 may leave the odd number of correctable erroneous data bits that belong the specific group uncorrected and issue an uncorrectable or corrupted data indication. Control module 1888 may also issue an uncorrectable or corrupted data indication if the syndrome does not indicate a specific group where multiple-bit errors having only an odd number of multiple erroneous data bits have occurred. In response, one or both of processors 1801 and 1802 may receive such indication from control module 1888 and perform appropriate tasks.

At least one of memory devices 1840, 1841, and 1842 may include a volatile memory device, a non-volatile memory device, or a combination of both. For example, at least one of memory devices 1840, 1841, and 1842 may include a dynamic random access memory (DRAM) device, a static random access memory (SRAM) device, a flash memory device, phase change memory device, or a combination of these memory devices.

The illustrations of apparatus (e.g., system 100, 200, 400, 500, 600, 700, 1500, and 1800) are intended to provide a general understanding of the structure of various embodiments and are not intended to provide a complete description of all the components and features of the apparatus and systems that might make use of the structures described herein.

Any of the components described above can be implemented in a number of ways, including simulation via software. Thus, at least a portion of the apparatus or the entire apparatus (e.g., system 100, 200, 400, 500, 600, 700, 1500, or 1800) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., system 100, 200, 400, 500, 600, 700, 1500, or 1800), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus (e.g., system 100, 200, 400, 500, 600, 700, 1500, or 1800) of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include apparatus and methods to enable correction of single-bit errors and detection of multiple-bit errors in groups of data bits of data information. The apparatus and methods also enable identifying a specific group among the groups if a multiple-bit error detected has an odd number of erroneous data bits that belong to only the specific group. Other embodiments including additional apparatus (e.g., system 100, 200, 400, 500, 600, 700, 1500, or 1800) and methods are described above with reference to FIG. 1 through FIG. 18.

The above description and the drawings illustrate some embodiments of the invention to enable those skilled in the art to practice the embodiments of the invention. Other embodiments may incorporate structural, logical, electrical, process, and other changes. Portions and features of some embodiments may be included in, or substituted for, those of others. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
   lines configured to transfer information that includes groups, each of the groups including bits, each of the lines configured to serially transfer the bits of one of the groups in a plurality of transfers; and
   a module configured to implement a matrix that includes a first portion to enable detection of errors in a number of transfers among the plurality of transfers and a second portion to enable identifying whether the detected errors have occurred to bits of one of the groups.

2. The apparatus of claim 1, wherein the module is configured to generate a value for each error information bit assigned to the first portion of the matrix based on values of bits from at least two of the groups.

3. The apparatus of claim 2, wherein the module is further configured to generate a value for each error information bit assigned to the second portion of the matrix based on value of a bit from each of the groups.

4. The apparatus of claim 3, wherein the first portion has a total number of first error information bits equal to T, where T is a number of the transfers, and wherein the second portion has a total number of second error information bits at least equal to a number of rows in the second portion of the matrix, such that a number of unique combinations of the rows, taken T at a times, is at least equal to a number of the lines used to transfer the information plus a number of additional lines used to transfer the first error information bits and the second error information bits.

5. The apparatus of claim 4, wherein the module is configured to implement the matrix based on Hamming codes.

6. An apparatus comprising:
lines configured to transfer information that includes groups; and
a module configured to:
assign an identification to each of the groups in information;
identify the identification of a specific group among groups if a single erroneous bit has occurred in the information and if the single erroneous bit belongs to the specific group; and
prevent at least one of misidentifying and ignoring multiple-bit errors if the multiple-bit errors include a plurality of erroneous data bits that belong to the specific group and if none of the other groups of the plurality of groups have errors.

7. The apparatus of claim 6, wherein the module is configured to correct the erroneous data bits of the specific group.

8. The apparatus of claim 6, wherein module assigns the identification based on a matrix containing a relationship between the information and error correction information associated with the information.

9. The apparatus of claim 8, wherein the matrix is created based in part on single-error-correction, double-error-detection (SECDED) Hamming codes.

10. The apparatus of claim 6, wherein a total number of the erroneous data bits is an odd number.

11. The apparatus of claim 10, wherein the module is configured to identify the identification of the specific group if the plurality of erroneous data bits belongs to only the specific group.

12. The apparatus of claim 6, the module is configured to:
organize the information into subsets such that each of the subsets is transferred in the same transfer among a number of transfers; and
group data bits of the information into the plurality of groups such that each of the subsets includes one data bit from each group of the plurality of groups.

13. The apparatus of claim 12, the module is configured to:
assign one error information bit among first error information bits of the error correction information to each of the transfers; and
assign one error information bit among second error information bits of the error correction information to data bits of multiple groups among the plurality of groups, wherein the identification of each of the group corresponds to a unique combination of the second error information bits.

14. The apparatus of claim 13, wherein the module organizes the subsets into an even number of subsets.

15. The apparatus of claim 13, wherein the module organizes the subsets into an odd number of subsets.

16. The apparatus of claim 13, wherein the subsets are organized as a total number of four subsets.

17. The apparatus of claim 13, wherein the module organizes the information such that each of the subsets includes the same number of bits.

18. A system comprising:
a controller;
a memory device; and
a module configured to transfer information between the memory device and the controller in plurality of transfers, the information including groups, each of the groups including bits and to implement a matrix that includes a first portion to enable detection of errors in a number of transfers among the plurality of transfers and a second portion to enable identifying whether the detected errors have occurred to bits of one of the groups.

19. The system of claim 18, wherein the controller is configured to receive from the module an indication that an error in the information is uncorrectable if the error having an odd number of multiple erroneous data bits and the odd number of multiple erroneous data bits belongs to only one of the groups.

20. The system of claim 18, wherein at least two of the controller, the memory device, and the module are enclosed in the same integrated circuit package.

* * * * *